(12) United States Patent
Grossmann et al.

(10) Patent No.: US 11,668,740 B2
(45) Date of Patent: Jun. 6, 2023

(54) OVER THE AIR CALIBRATION AND TESTING OF BEAMFORMING-BASED MULTI-ANTENNA DEVICES IN ANECHOIC AND NON-ANECHOIC ENVIRONMENTS

(71) Applicant: Fraunhofer-Gesellschaft zur Foerderung der angewandten Forschung e.V., Munich (DE)

(72) Inventors: Marcus Grossmann, Friedrichroda (DE); Markus Landmann, Zeitz (DE); Christopher Schirmer, Trusetal (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 358 days.

(21) Appl. No.: 16/797,877

(22) Filed: Feb. 21, 2020

(65) Prior Publication Data

US 2020/0191848 A1 Jun. 18, 2020

Related U.S. Application Data

(63) Continuation of application No. PCT/EP2017/071250, filed on Aug. 23, 2017.

(51) Int. Cl.
*G01R 27/28* (2006.01)
*G01R 29/10* (2006.01)
(Continued)

(52) U.S. Cl.
CPC ......... *G01R 29/105* (2013.01); *H04B 7/0413* (2013.01); *H04B 17/12* (2015.01)

(58) Field of Classification Search
CPC .. G01R 29/10; G01R 29/105; G01R 31/2822; G01R 31/31926; H04B 7/0413;
(Continued)

(56) References Cited

U.S. PATENT DOCUMENTS 8,971,178 B1 * 3/2015 Nabar ............... H04L 25/03949
370/335
9,107,098 B2 * 8/2015 Emmanuel ............ H04W 24/06
(Continued)

FOREIGN PATENT DOCUMENTS

CN 1720686 A 1/2006
CN 101816132 A 8/2010
(Continued)

OTHER PUBLICATIONS

E. H. Moore, "On the reciprocal of the general algebraic matrix," in Bulletin of the American Mathematical Society 26, 1920, pp. 394-395., 1920.
(Continued)

*Primary Examiner* — Thang X Le
(74) *Attorney, Agent, or Firm* — Perkins Coie LLP; Michael A. Glenn

(57) ABSTRACT

A method for wirelessly calibrating/testing RF and digital components of a multi-antenna device under test includes the step of wirelessly transmitting a first signaling information between the device under test and a device tester, the first signaling information indicating a calibration request, wherein the first signaling information is transmitted by the device under test or the device tester. Further, the method includes the step of estimating, in response to the first signaling information, channel transfer function matrices between active antenna ports/RF ports of the device under test and antenna ports of the device tester using reference signals wirelessly transmitted between the device tester and the device under test or vice versa.

38 Claims, 17 Drawing Sheets

(51) Int. Cl.
*H04B 17/12* (2015.01)
*H04B 7/0413* (2017.01)

(58) Field of Classification Search
CPC .... H04B 7/0452; H04B 17/10; H04B 17/101; H04B 17/102; H04B 17/12; H04B 17/18; H04B 17/21; H04B 17/24; H04B 17/29
See application file for complete search history.

(56) References Cited

U.S. PATENT DOCUMENTS

| | | | |
|---|---|---|---|
| 9,444,577 | B1* | 9/2016 | Zhang ............... H04L 25/03 |
| 9,614,627 | B2* | 4/2017 | Yu .................... H04B 17/3912 |
| 9,674,007 | B1* | 6/2017 | Wicker, Jr. ............ H04B 17/14 |
| 2006/0270343 | A1 | 11/2006 | Cha et al. |
| 2009/0093222 | A1 | 4/2009 | Sarkar |
| 2009/0153394 | A1 | 6/2009 | Navarro et al. |
| 2009/0310701 | A1 | 12/2009 | Shim et al. |
| 2010/0008406 | A1* | 1/2010 | Sawai ............. H04L 25/03006 455/75 |
| 2012/0230380 | A1 | 9/2012 | Keusgen et al. |
| 2013/0223554 | A1 | 8/2013 | Hong et al. |
| 2013/0294537 | A1 | 11/2013 | Cha et al. |
| 2015/0092824 | A1 | 4/2015 | Wicker et al. |
| 2015/0163073 | A1 | 6/2015 | Jindal et al. |
| 2016/0050569 | A1 | 2/2016 | Olgaard et al. |
| 2017/0048009 | A1* | 2/2017 | Sarkar ................. H04B 7/0628 |
| 2018/0227021 | A1 | 8/2018 | Ketchum et al. |

FOREIGN PATENT DOCUMENTS

| | | |
|---|---|---|
| CN | 102208933 A | 10/2011 |
| CN | 103220031 A | 7/2013 |
| CN | 106537803 A | 3/2017 |
| JP | 2006504370 A | 2/2006 |
| JP | 2011507000 A | 3/2011 |
| JP | 2012142964 A | 7/2012 |
| JP | 2014099861 A | 5/2014 |
| KR | 20070012638 A | 1/2007 |
| KR | 101263289 B1 | 5/2013 |
| KR | 20130097916 A | 9/2013 |
| WO | 2017135389 A1 | 8/2017 |

OTHER PUBLICATIONS

R. Penrose, "A generalized inverse for matrices," in Proceedings of the Cambridge Philosophical Society 51, 1955, pp. 406-413., 1955.

P. Kyösti, T. Jämsä, and J.-P. Nuutinen, "Channel modelling for multiprobe Over-the-Air MIMO testing," International Journal of Antennas and Propagation, vol. 2012, 2012., 2012.

C. Schirmer, M. Landmann,W. Kotterman, M. Hein, R. Thomä, G.Del Galdo, and A. Heuberger, "3D wave-field synthesis for testing of radio devices," in Antennas and Propagation (EuCAP), 2014 8th European Conference on, Apr. 2014, pp. 3394-3398., Apr. 2014.

M. Rumney, H. Kong, and Y. Jing, "Practical active antenna evaluation using the two-stage MIMO OTA measurement method," in Antennas and Propagation (EuCAP), 2014 8th European Conference on, Apr. 2014, pp. 3500-3503., Apr. 2014.

M. Rumney, H. Kong, Y. Jing, and X. Zhao, "Advances in antenna pattern-based MIMO OTA test methods," in Antennas and Propagation (EuCAP), 2015 9th European Conference on, Apr. 2015., Apr. 2015.

Agilent Technologies, "Incorporating self-interference into the two-stage method," in 3GPP TSG RAN WG4 Meeting #66 MIMO OTA Ah hoc, Mar. 2013, available: ftp://ftp.3gpp.org/tsg_ran/WG4_Radio/TSGR4_AHs/TSGR4_66-AH-MIMO-OTA/Docs/R4-66AH-0012.zip., Mar. 2013.

Agilent Technologies,, "Impact of path isolation on radiated second stage," in 3GPP TSG RAN WG4 Meeting, #69, Nov. 2013, available: http://www.3gpp.org/ftp/tsg_ran/WG4_Radio/TSGR4_69/docs/R4- 136799.zip., Nov. 2013.

"MIMO over-the-air testing for electrically large objects in non-anechoic environments", C. Schirmer, M. Lorenz, W. A. T. Kotterman, R. Perthold, M. H. Landmann and G. Del Galdo, 2016 10th European Conference on Antennas and Propagation (EuCAP), Davos, 2016, pp. 1-6. doi: 10.1109/EuCAP.2016.7481106, 2016.

"Universal Mobile Telecommunications System (UMTS); LTE; Universal Terrestrial Radio Access (UTRA) and Evolved Universal Terrestrial radio Access (E-UTRA); Verification of radiated multi-antenna reception performance of User Equipment (UE) (3GPP TR 37.977 v", European Telecommunications Standards Institute (ETSI), 14.3.0 Release 14, Mar. 2003, Mar. 2003.

* cited by examiner 3.5

3.7

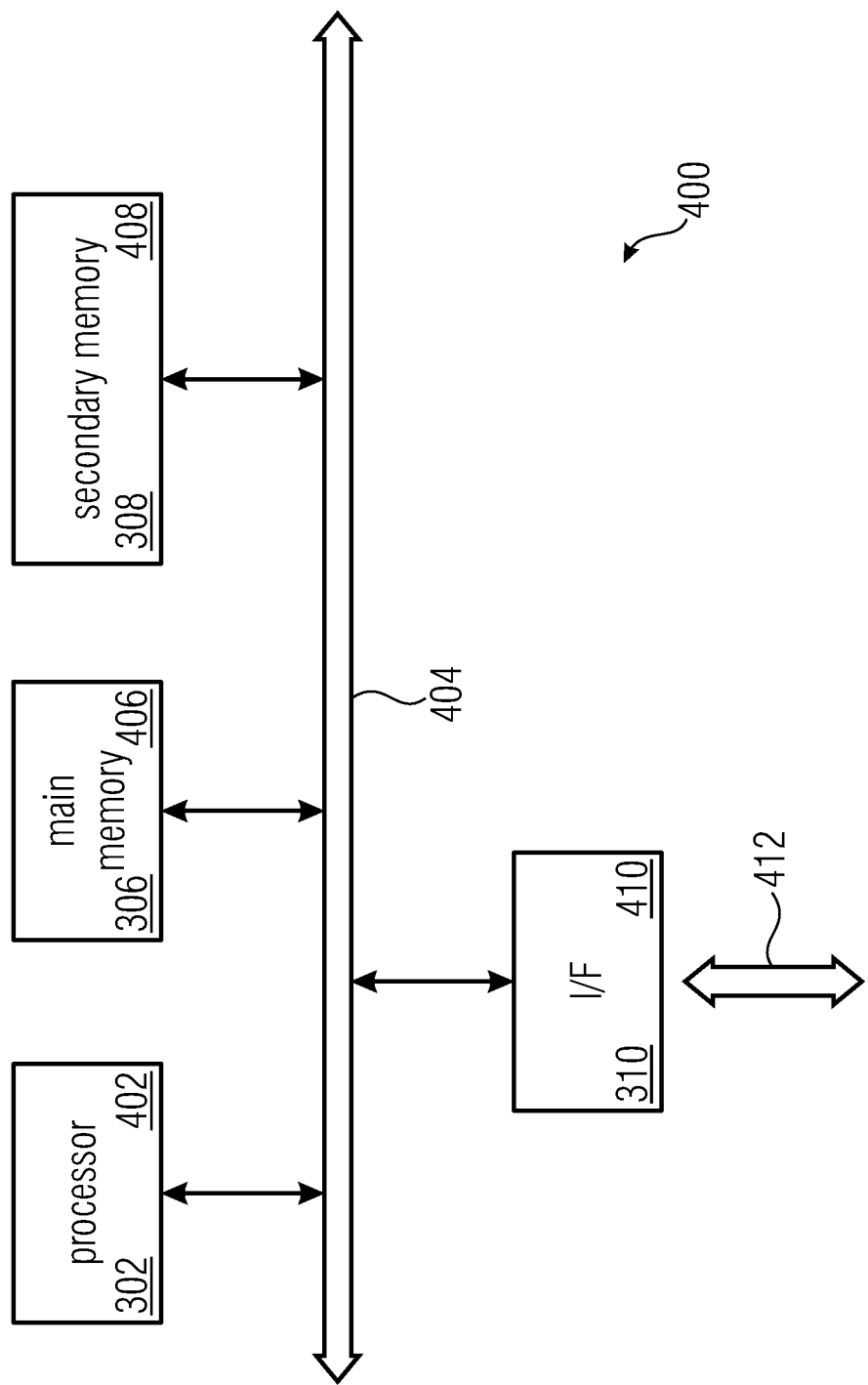

OVER THE AIR CALIBRATION AND TESTING OF BEAMFORMING-BASED MULTI-ANTENNA DEVICES IN ANECHOIC AND NON-ANECHOIC ENVIRONMENTS

CROSS-REFERENCES TO RELATED APPLICATION

This application is a continuation of copending International Application No. PCT/EP2017/071250, filed Aug. 23, 2017, which is incorporated herein by reference in its entirety.

Embodiments relate to a method for wirelessly calibrating a multi-antenna transceiver of a device under test, and in detail, to a method for wirelessly calibrating a beamforming network and/or a transceiver module (Rx module and/or Tx module) of the device under test. Some embodiments relate to calibration and testing of hybrid analog/digital beamforming-based multi-antenna devices in anechoic and non-anechoic environments.

BACKGROUND OF THE INVENTION

Wireless communication devices equipped with multiple antennas have to be calibrated and tested with respect to overall performance and conformance.

A well-known method for device testing is the so-called conducted test (CT) where the device' antennas are disconnected from the device under test (DUT) and a device tester is directly connected to the DUT. In such a conducted test, no wireless transmission is performed between the DUT and the device tester. This test setup in its simple manner does not consider the DUT' antenna radiation patterns during the device testing. A major drawback of the conducted test is that any kind of beamforming/beam-processing algorithms implemented in the DUT cannot be evaluated, as all signals "virtually" impinge at the same direction. Moreover, no direction- or frequency-dependent signal amplification or attenuation may be noticeable as the DUT' antennas are not present in this test.

An extension of the conducted test is the so called two-stage method (TSM) [1], see FIGS. 1a, 1b and 2. In detail, FIGS. 1a and 1b show schematic views of antenna measurement principles for small devices and for large devices, respectively. FIG. 2 shows a schematic view of a calibration/test setup 10 for the TSM. In this setup, the DUT' 12 antenna radiation patterns are measured at a first stage (FIGS. 1a and 1b) in an antenna measurement chamber where the DUT' antennas are rotated 16 such that a desired azimuth and elevation angle range is covered.

When the size of the DUT 12 is too large to be rotated in all desired angular directions, it can be put onto a turntable to cover the azimuth angles by rotating the DUT 12; the elevation angles are covered by movement of the transmitter antenna or by switching the active antenna on an antenna arc, cf. FIG. 1b. At the second stage of the TSM, a conducted test between the device tester (e.g. eNodeB) and the DUT 12 is performed (see FIG. 2). In contrast to the simple CT setup described above, the DUT' antenna radiation patterns and the MIMO propagation channel are contained in the digital baseband signals.

In the TSM channel emulators emulate a time-variant MIMO propagation channel between the device tester/control site (CS) 18, and the DUT 12. When the communication link between the CS and DUT is successfully established, different performance metrics of the communication link are measured and analyzed, such as data throughput, received signal strength, etc. A major disadvantage of the conducted testing, however, is that self-interference effects caused by antenna coupling of the DUT antennas cannot be considered during the test. Furthermore, typical in-band interferences caused either by signals radiated from other devices in the close vicinity of the DUT, or from non-conformant radio devices cannot be evaluated during the test.

The radiated two-stage method (RTS) [2-5], cf. FIG. 3 performs the TSM over-the air (OTA) in an anechoic chamber. Both self- and in-band-interference effects can be evaluated by this approach. Similar to the TSM, the DUT antenna radiation patterns are measured before device testing. For the RTS approach, the CS 18 radiates or receives phase coherent signals via O CS antenna ports 21/N OTA antennas 22, while the DUT 12 which is equipped with M antenna ports 19, receives or radiates the signals. In a first step, the chamber's 24 propagation channel characteristic is measured and stored in a channel matrix $H_C \in \mathbb{C}^{M \times O}$. During this calibration measurement, the DUT antennas (DUT' antenna ports) 19 are disconnected from the DUT 12. Based on the measured channel matrix $H_C$, a precoder matrix is computed and applied to the transmit signals at the CS to realize orthogonal channels and to remove the influence of the chamber's propagation characteristic between the OCS-antenna ports 21/N OTA antennas 22 and the M DUT antenna ports 19. There exists a variety of approaches for signal precoding. As an example, the precoder matrix can be calculated by the Moore-Penrose pseudo-inverse of the channel transfer matrix $H_C$. Furthermore, a realistic MIMO propagation channel matrix $H_T$ that contains the measured DUT antenna radiation pattern(s) can be incorporated in the transmit signal at the CS. Device testing is then performed by establishing a communication link between the CS and DUT and evaluating the performance.

The extension of the RTS-method is the so-called Wireless Cable approach (WLC), cf. FIG. 4, [7] that can be applied in non-anechoic environments.

WLC description: The received signal at the DUT 12 (downlink case) is given as $$y(q) = H_C(f) \cdot P(q) \cdot x(q), q=1, \ldots, Q,$$

where y(q) is the frequency-dependent received signal vector at the DUT 12 antenna ports 19 at frequency-bin q (q=1, ..., Q), x(q) is the frequency-dependent radiated signal at the CS 22, and P(q) is the frequency-dependent precoding matrix. To measure the channel matrices $H_C(f)$ between the antenna ports 19 of the DUT 12 and the CS ports 21, reference signals are transmitted and the precoding matrices P(q), q=1, Q are set to identity matrices. Then, by pseudo-inversion of the channel matrix $H_C$ and multiplication with a desired propagation channel matrix $H_T$, the precoder matrix can be calculated as $$P = H_C^+ H_T.$$

Note that for simplicity, the frequency dependent notation has been omitted.

For the RTS (narrow band) and the WLC (wide band) method the following calibration procedure for the channel matrix $H_C$ is applied. To measure the influence of the N OTA antennas 22 at the CS-side 18, the DUT antennas 20 and the propagation channel of the chamber 24, the DUT 12 backend has to be separated from the DUT-antennas 20. At the DUT-antenna ports 19, the calibration measurement system has to be connected via cables to measure the chamber's 24 propagation channel characteristics including the OTA antenna 22 and DUT antennas 20 characteristics.

For small-sized DUTs, wave field synthesis (WFS) or the MIMO Multiprobe method [10,11] can be applied for device testing as well. Hereby, a set of plane waves, defined by the targeted propagation channel characteristic are emulated. This is done by an arrangement of several OTA emulation antennas. The number of emulation antennas and the operation frequency dictates the maximum dimension of a DUT in which plane waves can be emulated. The drawback of the WFS method is the high number of needed emulation antennas. As an example, 24 emulation antennas at an operating frequency of 1.5 GHz in a 2D antenna arrangement allow for a maximum electrical DUT size of approximately 0.7 m. Additionally, all signal paths that feed the emulation antennas have to be phase coherent for WFS. Compared to the other mentioned methods, WFS is the most expensive one in terms of hardware requirements especially if the DUT is large. Furthermore, this method cannot be applied in non-anechoic environments. This method is mentioned here for completion and because it does not require a DUT calibration as the previously mentioned methods.

FIG. 5 gives an overview of the existing test methods by showing the advances of each approach. The methods marked with a rectangle operate in non-anechoic environments; wile methods marked with a triangle can be used only in anechoic environments. As shown in FIG. 5, the above described TSM (see FIG. 2), RTS method (see FIG. 3) and WLC method (see FIG. 4) are only suitable for DUTs that allow disconnecting the DUT' antennas from the antenna ports. Although the WFS method can be used for highly integrated devices, it is very expensive and complex one in terms of hardware requirements.

To summarize, device interfaces of highly integrated communication devices are neither available nor accessible. As a consequence, non-destructive testing or calibration of the device' components (e.g., antennas, beamforming networks and down/up-converters, etc.) become impossible or very difficult.

SUMMARY

According to an embodiment, a method for wirelessly calibrating/testing a beamforming network of a multi-antenna receiver of a device under test may have the steps of: wirelessly transmitting a first signaling information between the device under test and a device tester, the first signaling information indicating a calibration request, wherein the first signaling information is transmitted by the device under test or the device tester; estimating, in response to the first signaling information, channel transfer function matrices between active antenna ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester; wirelessly transmitting a second signaling information between the device under test and the device tester, the second signaling information indicating a precoded transmission request, wherein the second signaling information is transmitted by the device under test or the device tester; and wirelessly transmitting, in response to the second signaling information, precoded reference signals from the device tester to the device under test using precoder matrices selected or determined based on the estimated channel transfer function matrices or the information derived therefrom, to acquire interference free channels between the device tester and the device under test allowing the reference signals to be received independently at each of the active antenna ports of the multi-antenna receiver of the device under test.

According to another embodiment, a method for wirelessly calibrating/testing a beamforming network of a multi-antenna transmitter of a device under test may have the steps of: wirelessly transmitting a first signaling information between the device under test and a device tester, the first signaling information indicating a calibration request, wherein the first signaling information is transmitted by the device under test or the device tester; estimating, in response to the first signaling information, channel transfer function matrices between active antenna ports of the multi-antenna transmitter of the device under test and antenna ports of the device tester using reference signals wirelessly transmitted from the device under test to the device tester; selecting or estimating equalizer matrices using the estimated channel transfer function matrices or the information derived therefrom.

According to another embodiment, a method for wirelessly calibrating a receive module of a multi-antenna receiver of a device under test may have the steps of: wirelessly transmitting a first signaling information between the device under test and a device tester, the first signaling information indicating a calibration request, wherein the first signaling information is transmitted by the device under test or the device tester; estimating, in response to the first signaling information, channel transfer function matrices between RF ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester; wirelessly transmitting a second signaling information between the device under test and the device tester, the second signaling information indicating a precoded transmission request, wherein the second signaling information is transmitted by the device under test or the device tester; and wirelessly transmitting, in response to the second signaling information, reference signals from the device tester to the device under test using precoder matrices selected or determined based on the estimated channel transfer function matrices or the information derived therefrom, to acquire interference free channels between the device tester and the device under test allowing the reference signals to be received independently at each of the RF ports of the multi-antenna receiver of the device under test.

According to another embodiment, a method for wirelessly calibrating a transmit module of a multi-antenna transmitter of a device under test may have the steps of: wirelessly transmitting a first signaling information between the device under test and a device tester, the first signaling information indicating a calibration request, wherein the first signaling information is transmitted by the device under test or the device tester; estimating, in response to the first signaling information, channel transfer function matrices between RF ports of the multi-antenna transmitter of the device under test and antenna ports of the device tester using reference signals wirelessly transmitted from the device under test to the device tester; selecting or estimating equalizer matrices using the estimated channel transfer function matrices or the information derived therefrom.

According to another embodiment, a method for wirelessly calibrating antennas of a multi-antenna transceiver of a device under test may have the steps of: wirelessly transmitting a first signaling information between the device under test and a device tester, the first signaling information indicating a calibration request, wherein the first signaling information is transmitted by the device under test or the device tester; wirelessly transmitting reference signals between the device under test and the device tester using one active antenna port of the multi-antenna transceiver or using one RF port of the multi-antenna transceiver and a fixed beamforming network, wherein the reference signals are transmitted by the device under test or the device tester; measuring at least one out of amplitude and phase of an antenna pattern for a first relative orientation between antennas of the device tester and antennas of the device under test, changing the relative orientation between antennas of the device tester and antennas of the device under test from the first relative orientation to a second relative orientation; iteratively repeating the steps of wirelessly transmitting reference signals, measuring at least one out of amplitude and phase of the antenna pattern and changing the relative orientation until a predetermined termination criterion is reached.

According to another embodiment, a method for wirelessly calibrating/testing a digital receiver module of a multi-antenna receiver of a device under test may have the steps of: wirelessly transmitting a first signaling information between the device under test and a device tester, the first signaling information indicating a calibration request, wherein the first signaling information is transmitted by the device under test or the device tester; estimating, in response to the first signaling information, channel transfer function matrices between active antenna ports or RF ports of the multi-antenna receiver of the device under test and antenna ports of the device tester using reference signals wirelessly transmitted from the device tester to the device under test; wirelessly transmitting a second signaling information between the device under test and the device tester, the second signaling information indicating a precoded transmission request, wherein the second signaling information is transmitted by the device under test or the device tester; and wirelessly transmitting, in response to the second signaling information, reference signals from the device tester to the device under test using precoder matrices selected or determined based on the estimated channel transfer function matrices or the information derived therefrom, to acquire interference free channels between the device tester and the device under test allowing the reference signals to be received independently at each active antenna port or RF port of the multi-antenna receiver of the device under test.

According to another embodiment, a method for wirelessly calibrating/testing a digital transmitter module of a multi-antenna transmitter of a device under test may have the steps of: wirelessly transmitting a first signaling information between the device under test and a device tester, the first signaling information indicating a calibration request, wherein the first signaling information is transmitted by the device under test or the device tester; estimating, in response to the first signaling information, channel transfer function matrices between active antenna ports or RF ports of the multi-antenna transmitter of the device under test and antenna ports of the device tester using reference signals wirelessly transmitted from the device under test to the device tester; selecting or estimating equalizer matrices using the estimated channel transfer function matrices or the information derived therefrom.

Another embodiment may have a computer program for performing the method for wirelessly calibrating/testing a beamforming network of a multi-antenna receiver of a device under test, the method including wirelessly transmitting a first signaling information between the device under test and a device tester, the first signaling information indicating a calibration request, wherein the first signaling information is transmitted by the device under test or the device tester; estimating, in response to the first signaling information, channel transfer function matrices between active antenna ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester; wirelessly transmitting a second signaling information between the device under test and the device tester, the second signaling information indicating a precoded transmission request, wherein the second signaling information is transmitted by the device under test or the device tester; and wirelessly transmitting, in response to the second signaling information, precoded reference signals from the device tester to the device under test using precoder matrices selected or determined based on the estimated channel transfer function matrices or the information derived therefrom, to acquire interference free channels between the device tester and the device under test allowing the reference signals to be received independently at each of the active antenna ports of the multi-antenna receiver of the device under test, when said computer program is run by a computer.

According to another embodiment, a device under test may have: a beamforming network including a plurality of antenna ports and a plurality of RF ports; a plurality of antennas connected to the plurality of antenna ports of the beamforming network; an RF module connected to the plurality of RF ports of the beamforming network; and a processor configured to perform the inventive method.

According to another embodiment, a device tester may have: a beamforming network including a plurality of antenna ports and a plurality of RF ports; a plurality of antennas connected to the plurality of antenna ports of the beamforming network; an RF module connected to the plurality of RF ports of the beamforming network; and a processor configured to perform the inventive method.

Embodiments provide a method for wirelessly calibrating/testing a beamforming network of a multi-antenna receiver of a device under test (for example, the method may be used for calibrating/testing components of the multi-antenna receiver downstream (in receive direction) antenna ports of the multi-antenna receiver). The method comprises the step of wirelessly transmitting a first signaling information between the device under test and a device tester, the first signaling information indicating a calibration request, wherein the first signaling information is transmitted by the device under test or the device tester. Further, the method comprises the step of estimating, in response to the first signaling information, channel transfer function matrices between active antenna ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester. Further, the method comprises the step of wirelessly transmitting a second signaling information between the device under test and the device tester, the second signaling information indicating a precoded transmission request, wherein the second signaling information is transmitted by the device under test or the device tester.

Further, the method comprises the step of wirelessly transmitting, in response to the second signaling information, precoded reference signals from the device tester to the device under test using precoder matrices selected or determined based on the estimated channel transfer function matrices or the information derived therefrom, to obtain interference-free channels between the device tester and the device under test allowing the reference signals to be received independently at each of the active antenna ports of the multi-antenna receiver of the device under test.

Further embodiments provide a method for wirelessly calibrating/testing a beamforming network of a multi-antenna transmitter of a device under test (for example, the method may be used for calibrating/testing components of the multi-antenna transmitter upstream (in transmit direction) antenna ports of the multi-antenna transmitter). The method comprises the step of wirelessly transmitting a first signaling information between the device under test and a device tester, the first signaling information indicating a calibration request, wherein the first signaling information is transmitted by the device under test or the device tester. Further, the method comprises the step of estimating, in response to the first signaling information, channel transfer function matrices between active antenna ports of the multi-antenna transmitter of the device under test and the antenna ports of the device tester using reference signals wirelessly transmitted from the device under test to the device tester. Further, the method comprises the step of selecting or estimating equalizer matrices using the estimated channel transfer function matrices or the information derived therefrom.

Further embodiments provide a method for wirelessly calibrating/testing a receive module of a multi-antenna receiver of a device under test (for example, the method may be used for calibrating/testing components of the multi-antenna receiver downstream (in receive direction) RF ports of the multi-antenna receiver). The method comprises the step of wirelessly transmitting a first signaling information between the device under test and a device tester, the first signaling information indicating a calibration request, wherein the first signaling information is transmitted by the device under test or the device tester. Further, the method comprises the step of estimating, in response to the first signaling information, channel transfer function matrices between RF ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester. Further, the method comprises the step of wirelessly transmitting a second signaling information between the device under test and the device tester, the second signaling information indicating a precoded transmission request, wherein the second signaling information is transmitted by the device under test or the device tester. Further, the method comprises the step of wirelessly transmitting, in response to the second signaling information, reference signals from the device tester to the device under test using precoder matrices selected or determined based on the estimated channel transfer function matrices or the information derived therefrom, to obtain interference free channels between the device tester and the device under test allowing the reference signals to be received independently at each of the RF ports of the multi-antenna receiver of the device under test.

Further embodiments provide a method for wirelessly calibrating/testing a transmit module of a multi-antenna transmitter of a device under test (for example, the method may be used for calibrating/testing components of the multi-antenna transmitter upstream (in transmit direction) RF ports of the multi-antenna transmitter). The method comprises a step of wirelessly transmitting a first signaling information between the device under test and a device tester, the first signaling information indicating a calibration request, wherein the first signaling information is transmitted by the device under test or the device tester. The method comprises a step of estimating, in response to the first signaling information, channel transfer function matrices between RF ports of the multi-antenna transmitter of the device under test and antenna ports of the device tester using reference signals wirelessly transmitted from the device under test to the device tester. The method comprises a step of selecting or estimating equalizer matrices using the estimated channel transfer function matrices or the information derived therefrom.

Further embodiments provide a method for wirelessly calibrating/testing antennas of a multi-antenna transceiver of a device under test (for example, the method may be used for calibrating/testing components of the multi-antenna receiver downstream (in transmit direction) or upstream (in receive direction) antenna ports of the multi-antenna receiver). The method comprises a step of wirelessly transmitting a first signaling information between the device under test and a device tester, the first signaling information indicating an antenna calibration request, wherein the first signaling information is transmitted by the device under test or the device tester. Further, the method comprises a step of wirelessly transmitting reference signals between the device under test and the device tester using one active antenna port of the multi-antenna transceiver or using one RF port of the multi-antenna transceiver and a fixed beamforming network configuration, wherein the reference signals are transmitted by the device under test or the device tester. Further, the method comprises a step of measuring at least one out of amplitude and phase of a (full) (polarimetric) antenna pattern for a first relative orientation between antennas of the device tester and antennas of the device under test. Further, the method comprises a step of changing the relative orientation between the antennas of the device tester and antennas of the device under test to a second relative orientation. Further, the method comprises a step of iteratively repeating the steps of wirelessly transmitting reference signals, measuring at least one out of amplitude and phase of the (full) (polarimetric) antenna pattern and changing the relative orientation until a predetermined termination criterion is reached.

Further embodiments provide a method for wirelessly calibrating/testing a digital receiver module of a multi-antenna receiver of a device under test. The method comprises a step of wirelessly transmitting a first signaling information between the device under test and a device tester, the first signaling information indicating a calibration request, wherein the first signaling information is transmitted by the device under test or the device tester. Further, the method comprises a step of estimating, in response to the first signaling information, channel transfer function matrices between active antenna ports/RF ports of the multi-antenna receiver of the device under test and antenna ports of the device tester using reference signals wirelessly transmitted from the device tester to the device under test. Further, the method comprises a step of wirelessly transmitting a second signaling information between the device under test and the device tester, the second signaling information indicating a precoded transmission request, wherein the second signaling information is transmitted by the device under test or the device tester. Further, the method comprises a step of wirelessly transmitting, in response to the second signaling information, reference signals from the device tester to the device under test using precoder matrices selected or determined based on the estimated channel transfer function matrices or the information derived therefrom, to obtain interference free channels between the device tester and the device under test allowing the reference signals to be received independently at each active antenna port/RF port of the multi-antenna receiver of the device under test. Thereby, an analog beamforming network of the multi-antenna receiver is set to specific beamforming network parameters and maintained fixed at the set specific beamforming network parameters, during calibrating/testing the digital receiver module of the multi-antenna receiver, even if the propagation channel between the device under test and the device tester changes to emulate a multipath propagation channel. In that case, a third signaling information can be wirelessly transmitting from the device under test to the device tester, the third signaling information indicating specific beamforming network operating parameters the device under test would apply in a normal operation mode to the analog beamforming network responsive to the emulated multipath propagation channel in order to adapt the analog beamforming network in the normal operation mode to the multipath propagation channel.

Further embodiments provide a method for wirelessly calibrating/testing a digital transmitter module of a multi-antenna transmitter of a device under test. The method comprises a step of wirelessly transmitting a first signaling information between the device under test and a device tester, the first signaling information indicating a calibration request, wherein the first signaling information is transmitted by the device under test or the device tester. The method further comprises a step of estimating, in response to the first signaling information, channel transfer function matrices between active antenna ports or RF ports of the multi-antenna transmitter of the device under test and antenna ports of the device tester using reference signals wirelessly transmitted from the device under test to the device tester. The method further comprises a step of selecting or estimating equalizer matrices using the estimated channel transfer function matrices or the information derived therefrom. Thereby, an analog beamforming network of the multi-antenna transmitter is set to specific beamforming network parameters and maintained fixed at the set specific beamforming network parameters, during calibrating/testing the digital transmitter module of the multi-antenna transmitter, even if the propagation channel between the device under test and the device tester changes to emulate a multipath propagation channel. In that case, a third signaling information can be wirelessly transmitting from the device under test to the device tester, the third signaling information indicating specific beamforming network operating parameters the device under test would apply in a normal operation mode to the analog beamforming network responsive to the simulated multipath propagation channel in order to adapt the analog beamforming network in the normal operation mode to a multipath propagation channel.

BRIEF DESCRIPTION OF THE DRAWINGS

Embodiments of the present invention will be detailed subsequently referring to the appended drawings, in which:

FIG. 18 illustrates an example of a computer system on which units or modules as well as the steps of the methods described in accordance with the inventive approach may execute.

DETAILED DESCRIPTION OF THE INVENTION

Figure 1A:
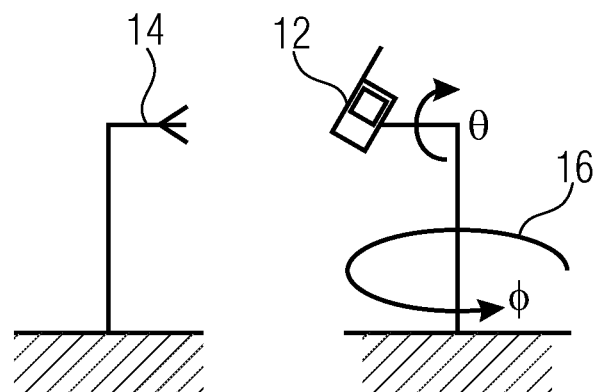
FIG. 1a shows a schematic view of an antenna measurement principle for small devices.
Figure 1B:
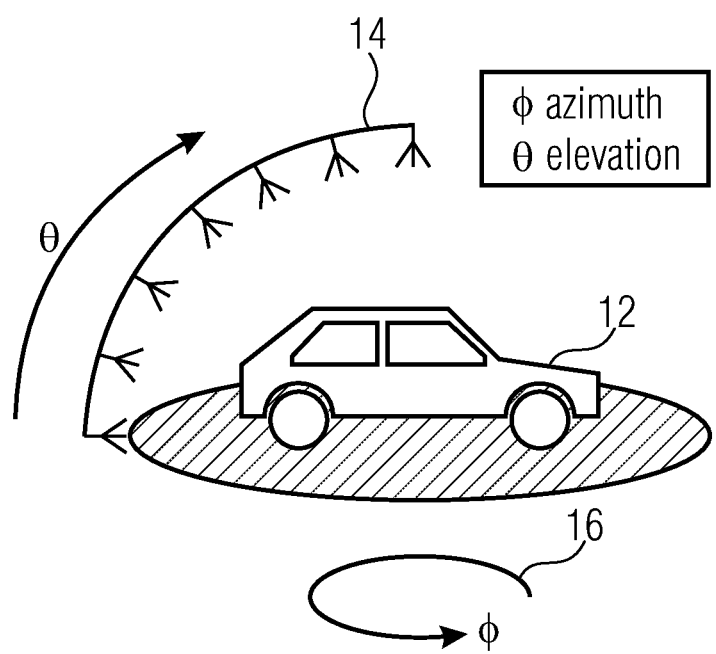
FIG. 1b shows a schematic view of an antenna measurement principle for large devices.
Figure 2:
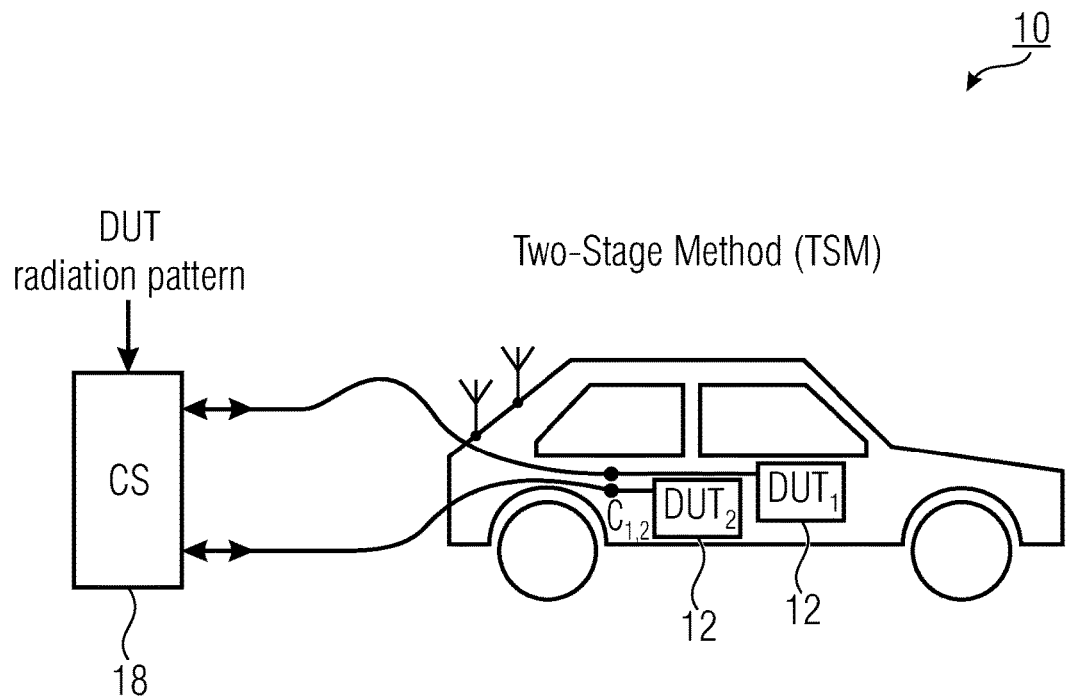
FIG. 2 shows a sematic view of a calibration/test setup for the two-stage method.
Figure 3:
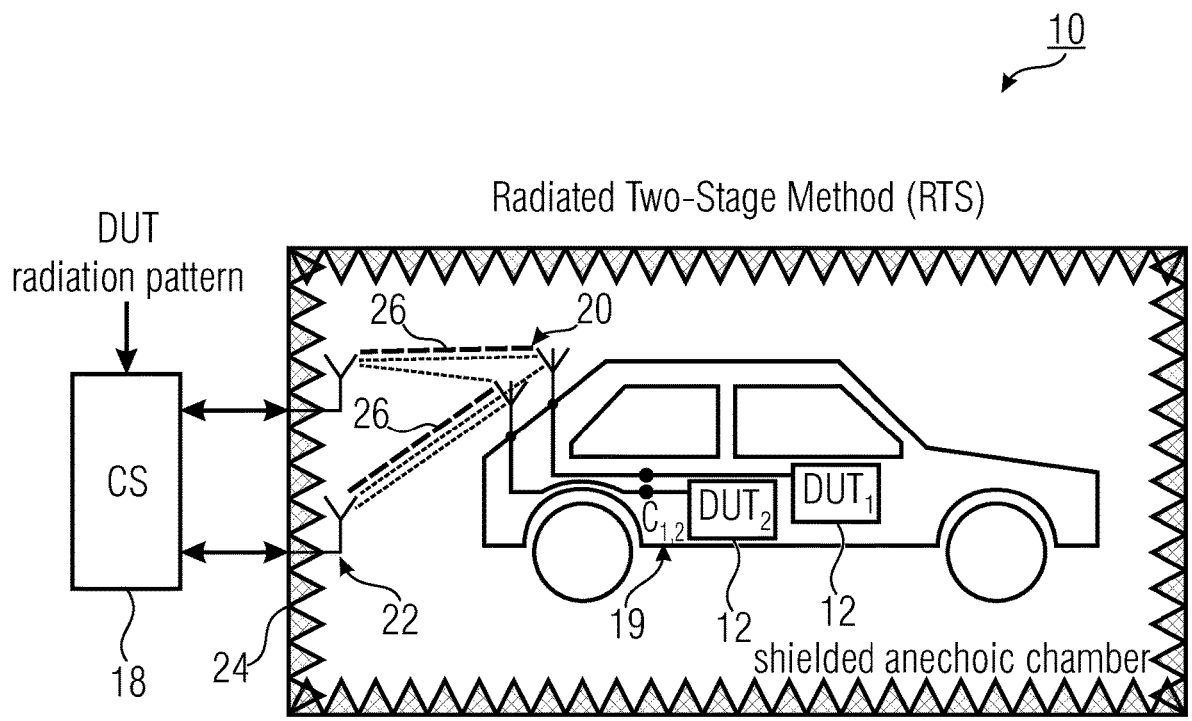
FIG. 3 shows a schematic view of a calibration/test setup for the radiated two-stage method in an anechoic chamber.
Figure 4:
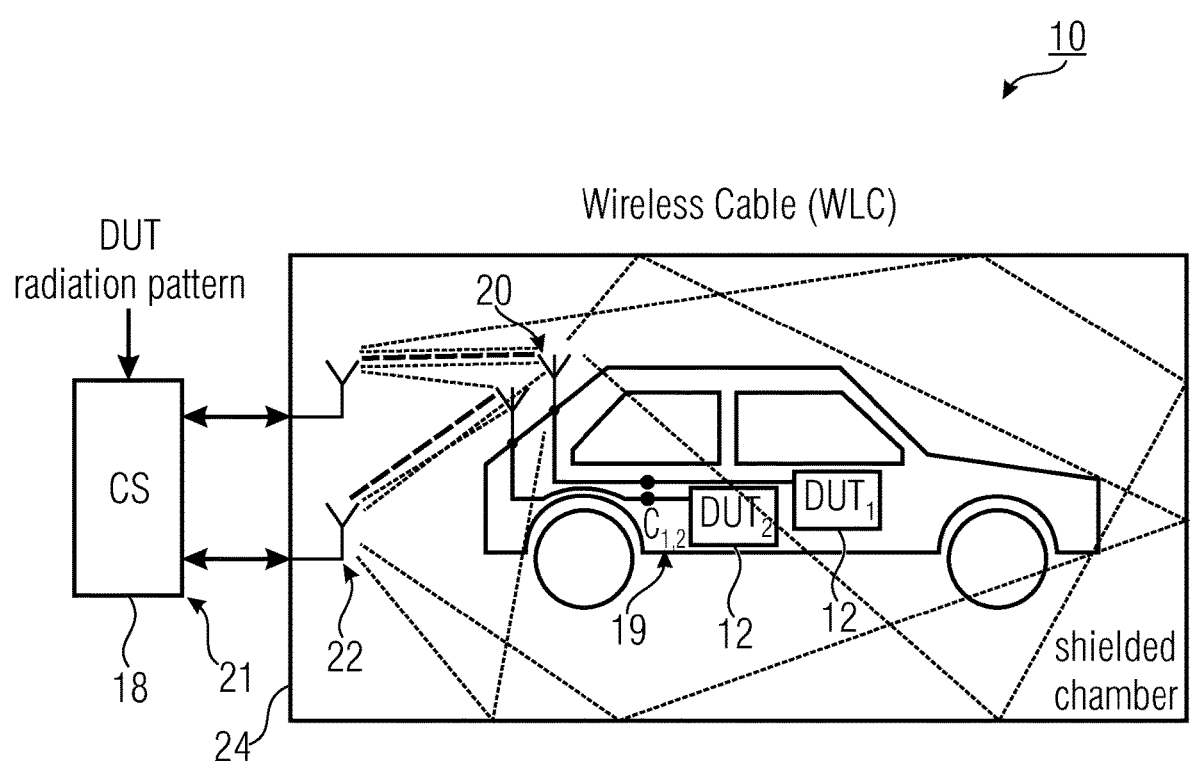
FIG. 4 shows a schematic view of a calibration/test setup for the wireless cable method in a non-anechoic chamber.
Figure 5:
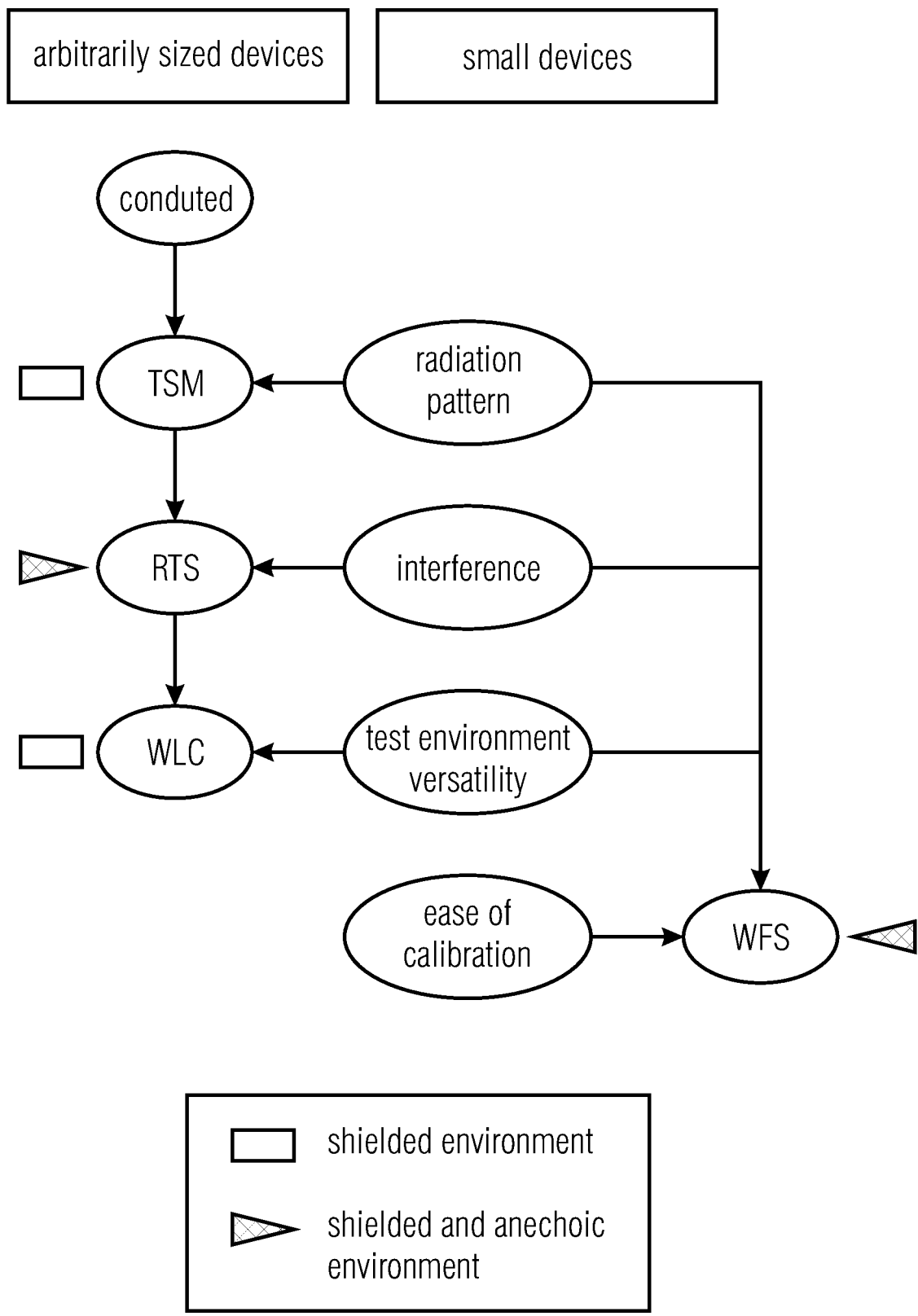
FIG. 5 shows in a diagram an overview of the existing test methods by presenting the advances of each.

Equal or equivalent elements or elements with equal or equivalent functionality are denoted in the following description by equal or equivalent reference numerals.

In the following description, a plurality of details is set forth to provide a more thorough explanation of embodiments of the present invention. However, it will be apparent to one skilled in the art that embodiments of the present invention may be practiced without these specific details. In other instances, well-known structures and devices are shown in block diagrams form rather than in detail in order to avoid obscuring embodiments of the present invention. In addition, features of the different embodiments described hereinafter may be combined with each other, unless specifically noted otherwise.

Figure 6:
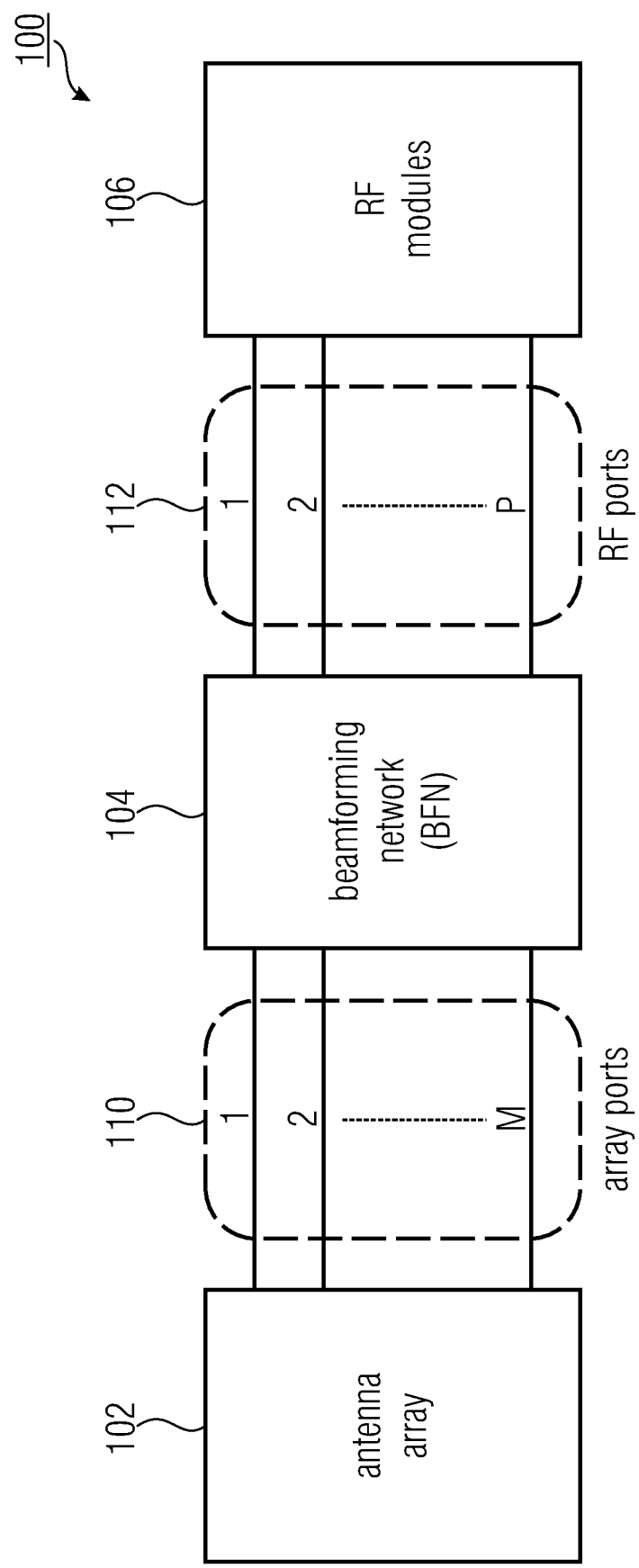
FIG. 6 shows a schematic block diagram of a multi-antenna transceiver of a device under test, according to an embodiment.
Figure 7A:
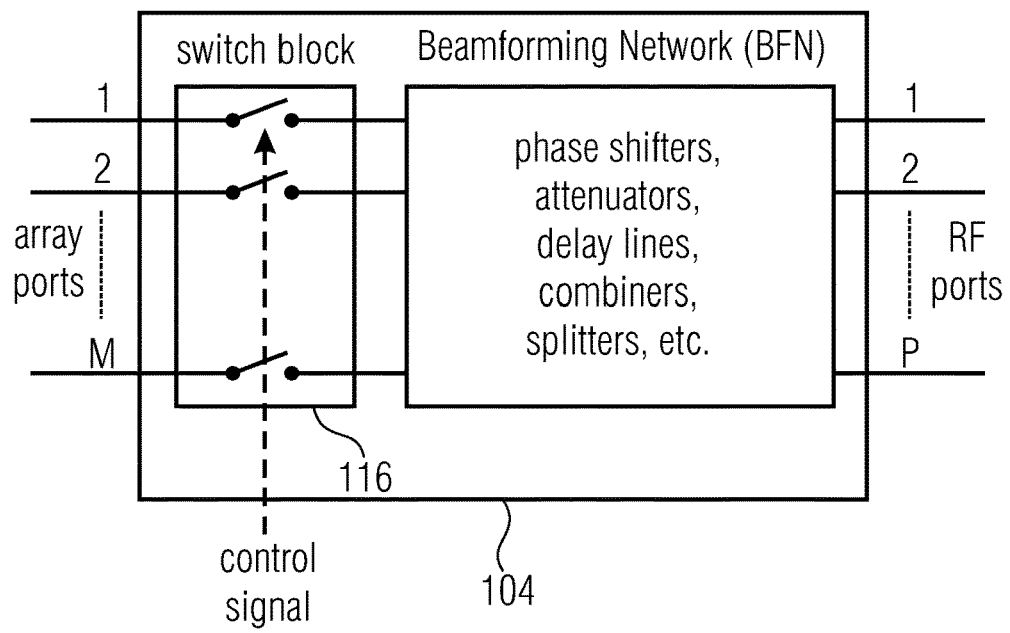
FIG. 7a shows a schematic block diagram of a beamforming network comprising a separate switch block configured to selectively activate or deactivate each antenna port of the M antenna ports of the beamforming network, according to an embodiment.
Figure 7B:
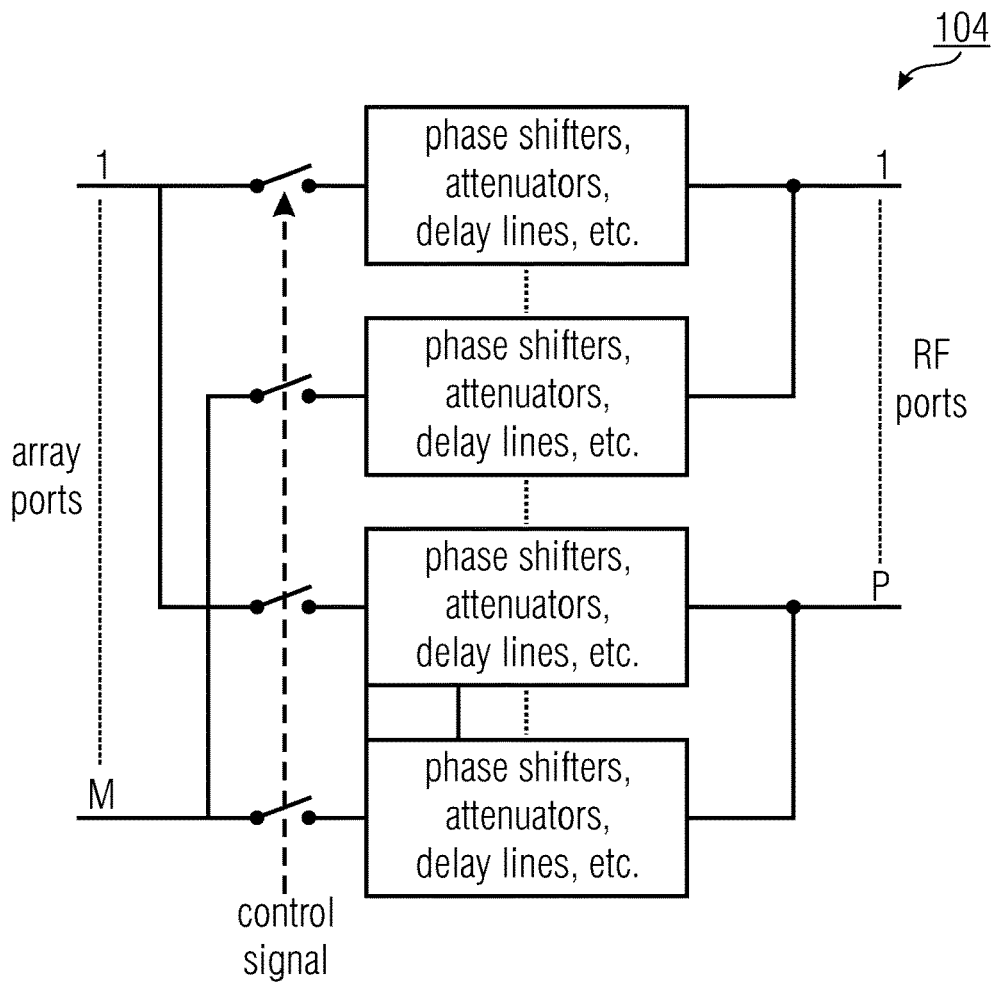
FIG. 7b shows a schematic block diagram of a beamforming network having integrated switches configured to selectively activate or deactivate each antenna port of the M antenna ports of the beamforming network, according to an embodiment.
Figure 8:
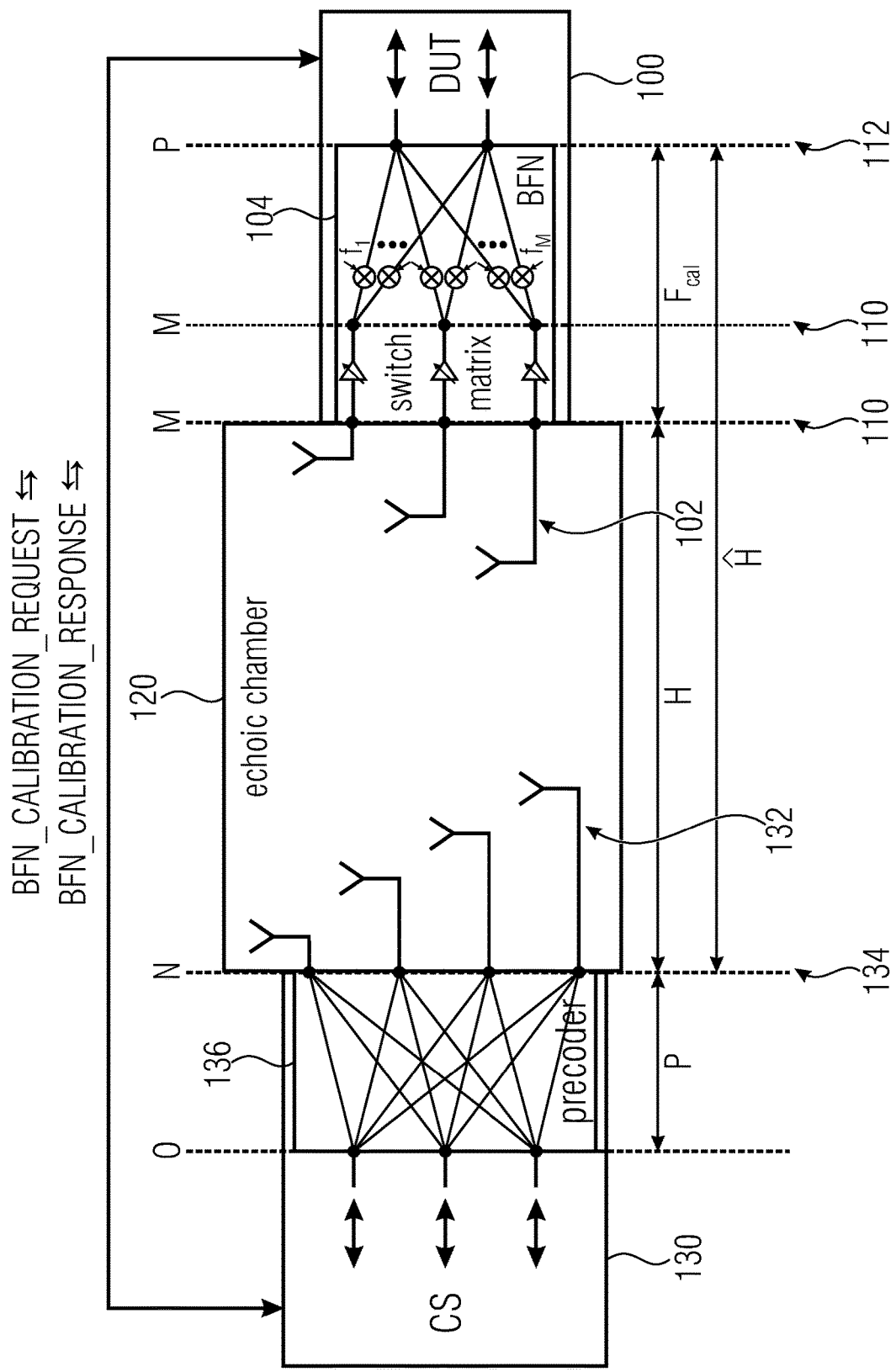
FIG. 8 shows a schematic block diagram of a calibration/testing setup for calibrating/testing components of the multi-antenna transceiver of the device under test, according to an embodiment.

Before embodiments of methods for calibrating/testing RF components (e.g., antennas, antenna ports, RF ports, beamforming networks, Tx modules (Tx=transmitter) or Rx modules (Rx=receiver)) of a wireless communication device, referred herein as to device under test (DUT) 100, are described in further detail, the device itself is described making reference to FIGS. 6, 7a and 7b and the calibration/test setup is described making reference to FIG. 8.

FIG. 6 shows a schematic block diagram of a multi-antenna transceiver (transmitter and/or receiver) of a device under test 100. The multi-antenna transceiver of the device under test 100 comprises an antenna array 102, a beamforming network 104 and at least one RF module 106. The beamforming network 104 comprises M array ports (or antenna ports) 110 and P RF ports 112, wherein M can be a natural number greater than or equal to two, M≥2, and wherein P can be a natural number greater than or equal to two, P≥2. The antenna array 102, or more precisely, the M antennas of the antenna array 102 can be connected to the M array ports 110 of the beamforming network 104, wherein the at least one RF module 106 can be connected to the P RF ports 112 of the beamforming network 104. Further, the multi-antenna transceiver (transmitter and/or receiver) of the device under test 100 may comprise at least one transceiver module (e.g., at least one transmitter module and/or at least one receiver module), configured to perform a digital signal processing. The at least one transceiver module can be connected to the at least one RF module 106. Further, the Further, the multi-antenna transceiver (transmitter and/or receiver) of the device under test 100 may comprise analog-to-digital converters and/or digital-to-analog converters connected between the at least one RF module 106 and the at least one (digital) transceiver module.

In embodiments, the beamforming network 104 can be an analog beamforming network.

Further, in embodiments, the multi-antenna transceiver can be configured to perform a digital beamforming e.g., using the at least one transceiver module. In other words, the multi-antenna transceiver can comprise a hybrid beamforming network having an analog portion and a digital portion. Thereby, the analog portion of the hybrid beamforming network can be implemented in the beamforming network 104, wherein the digital portion of the beamforming network can be implemented in the at least one transceiver module.

Further, in embodiments, the multi-antenna transceiver also can comprise only a digital beamforming network implemented in the at least one transceiver module. In that case, the M antenna ports 110 may be connected directly to the P RF ports 112, such that each antenna port is connected to exactly one RF port, i.e. M=P.

In the below description of embodiments, it is exemplarily assumed that the multi-antenna transceiver comprises a hybrid beamforming network. However, the present invention is not limited to such embodiments. Rather, the below description is also applicable to analog and/or digital beamforming networks.

In embodiments, the relative amplitude and phase values across the antenna elements of the array 102 define the beams of the antenna array 102. These relative phase and amplitude values are generated by the beamforming network (e.g., analog beamforming network 104 and/or digital beamforming network implemented in the at least one RF module 106) that may comprise, for example, a plurality of phase shifters, controllable attenuators\PAs in Tx (PA=power amplifier)\LNAs in Rx (LNA=low noise amplifier), delay lines, etc., that are connected to the antenna elements of the array 102. The beamforming network 104 can comprise M array ports (or antenna ports) 110 and P RF ports 112 that are connected to the M antenna elements 102 and the P transmit/receive (RF) modules 106 of the DUT 100, respectively (see FIG. 6).

In embodiments, a switch block can be included in the beamforming network 104 for calibration purposes, as shown by way of example in FIGS. 7a and 7b. In detail, FIG. 7a shows a schematic block diagram of a beamforming network 104 comprising a separate switch block 116 configured to selectively activate or deactivate each antenna port of the M antenna ports 110 of the beamforming network, wherein FIG. 7b shows a schematic block diagram of a beamforming network 104 having integrated switches configured to selectively activate or deactivate each antenna port of the M antenna ports 110 of the beamforming network. In other words, FIGS. 7a and 7b show examples of beamforming networks including a switch block for calibration purpose with a control signal. The switches in the switch block 116 can be controllable by a control signal and can disconnect selectively the antenna ports 110 from the BFN 104 (see FIG. 7a). Alternatively, the switch block can be directly a part of the beamforming network 104 (see FIG. 7b). The switches can be responsible to connect selectively a single array port m to a single RF port p during the calibration process.

Alternatively, instead of a switch block, LNAs (in receive mode of the DUT 100) or PAs (in transmit mode of the DUT 100) at the selected antenna elements can directly be switched off to increase the isolation between different antenna elements (switched off could mean, for example, a 30 dB higher isolation but depends upon the LNAs or PAs). In such a case, each LNA or PA at an antenna element or a plurality of LNAs or PAs (e.g. included in the beamforming network 104) can jointly be gated by a control signal to "on" (i.e., activated) or to "off" (i.e., non-activated or deactivated). In the case that an LNA/PA is gated to "on" the signal from the related antenna/BFN array port can be amplified and passed to the BFN array port\antenna.

The above three configurations allow to remove or at least to reduce undesired coupling of array ports 110 or antenna elements during the calibration process.

FIG. 8 shows a schematic block diagram of a calibration/testing setup for calibrating/testing components of the multi-antenna transceiver of the device under test 100. As shown in FIG. 8, the device under test 100 can be placed or positioned in an echoic chamber 120, wherein a device tester (or control site) 130 can be used for performing the calibration/testing of the components of the device under test 100.

As already mentioned with respect to FIG. 6, the multi-antenna transceiver of the device under test 100 can comprise an antenna array 102, an analog beamforming network 104 and at least one RF module (not shown in FIG. 8). The analog beamforming network 104 comprises M array ports (or antenna ports) 110 and P RF ports 112. The antenna array 102, or more precisely, the M antennas of the antenna array 102 can be connected to the M array ports 110 of the beamforming network 104. The switch matrix 136, which can also be implemented directly in the beamforming network (see FIG. 6b) or be realized by controlling, for example, the LNAs or PAs accordingly, is also indicated in FIG. 8.

The control side 130 can comprise N antennas 132 connected to N antenna ports 134 of a precoder 136 of the control side 130.

Subsequently, methods for calibrating/testing components (e.g., antennas, antenna ports, RF ports, beamforming networks, Tx modules (Tx=transmitter) or Rx modules (Rx=receiver)) of the multi-antenna transceiver (or transmitter or receiver) of the device under test 100 are described making reference to the calibrating/testing setup shown in FIG. 8.

DUT BFN Receive Mode Calibration

Figure 9:
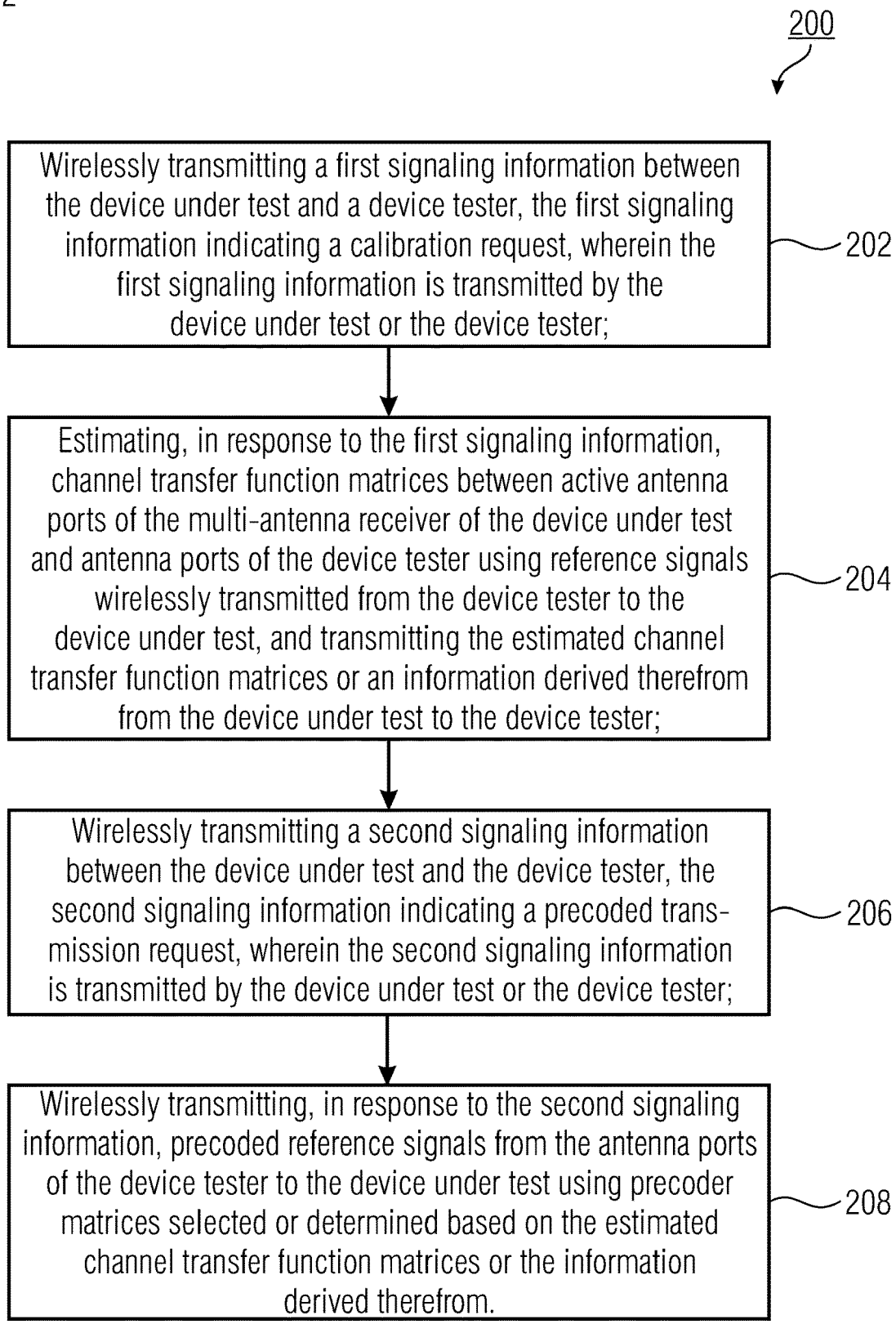
FIG. 9 shows a flowchart of a method for wirelessly calibrating a beamforming network of a multi-antenna receiver of a device under test, according to an embodiment.

FIG. 9 shows a flowchart of a method 200 for wirelessly calibrating a beamforming network of a multi-antenna receiver of a device under test 100, according to an embodiment. For example, the method 200 may be used for calibrating/testing components (i.e., the beamforming network 104) of the multi-antenna receiver downstream (in receive direction) antenna ports 110 of the multi-antenna receiver.

The method 200 comprises the step of wirelessly transmitting a first signaling information between the device under test 100 and a device tester 130, the first signaling information indicating a calibration request, wherein the first signaling information is transmitted by the device under test 100 or the device tester 130.

For example, the calibration request can be initiated by the device under test 100 itself. In this case, the device under test 100 may transmit the first signaling information with the calibration request to the device tester 130. Alternatively, the calibration request can be initiated by the device tester 130. In this case, the device tester 130 may transmit the first signaling information with the calibration request to the device under test 100 which receives the first signaling information. The device under test 100 may switch into a calibration mode (different from a normal operation mode) upon transmitting or receiving the first signaling information.

For example, the first signaling information can be a BFN_CALIBRATION_REQUEST message.

Further, the method 200 comprises a step 204 of estimating, in response to the first signaling information, channel transfer function matrices between active antenna ports 110 of the multi-antenna receiver of the device under test 100 and antenna ports 134 of the device tester 130 using reference signals wirelessly transmitted from the device tester 130 to the device under test 100, and transmitting the estimated channel transfer function matrices or an information derived therefrom from the device under test 100 to the device tester 130.

For example, the estimated channel transfer function matrices or the information derived therefrom can be transmitted to the device tester 130 using a BFN_CALIBRATION_RESPONSE message.

In embodiments, the step 204 can comprise connecting each active antenna port 110 of the beamforming network 104 to exactly one RF port 112 of beamforming network for estimating the channel transfer function matrices.

In embodiments, the step 204 can comprise activating a first group of antenna ports of the beamforming network 104 of the device under test 100, to obtain the active antenna ports, while deactivating the other antenna ports of the beamforming network 104. Thus, channel transfer function matrices describing the channels between the first group of active antenna ports and the antenna ports 134 of the device tester 130 are obtained.

Optionally, the step 204 can comprise activating a second group of antenna ports 110 of the beamforming network 104 of the device under test 100, while deactivating the other antenna ports of the beamforming network 104, and estimating channel transfer function matrices between the second group of antenna ports of the device under test and antenna ports of the device tester using reference signals wirelessly transmitted from the device tester 130 to the device under test 100, to obtain channel transfer function matrices describing channels between the second group of active antenna ports and the antenna ports 134 of the device tester 130. These channel transfer function matrices can also be transmitted (e.g., together with the previously estimated channel transfer function matrices) to the device tester 130.

Further, the method 200 comprises the step 206 of wirelessly transmitting a second signaling information between the device under test 100 and the device tester 130, the second signaling information indicating a precoded transmission request, wherein the second signaling information is transmitted by the device under test 100 or the device tester 130.

For example, the second signaling information can be a OTA_PRECODING_REQUEST message.

Further, the second signaling information may also indicate the active antenna ports of the multi-antenna receiver of the device under test, such as the first group of active antenna ports and the second group of active antenna ports.

Further, the method 200 comprises a step 208 of wirelessly transmitting, in response to the second signaling information, precoded reference signals from the device tester 130 to the device under test 100 using precoder matrices selected or determined based on the estimated channel transfer function matrices or the information derived therefrom, to obtain interference free channels (or orthogonal channels) between the device tester 130 and the device under test 100 allowing the reference signals to be received independently at each of the active antenna ports 110 of the multi-antenna receiver of the device under test 100.

For example, after selecting or determining the precoder matrices and prior to transmitting the reference signals to the device under test 100, the device tester 130 may transmit a OTA_PRECODING_RESPONSE message indicating the following transmission of reference signals.

In embodiments, the step 208 can comprise activating the first group of antenna ports of the beamforming network 104 of the device under test 100, to obtain the active antenna ports, while deactivating the other antenna ports of the beamforming network 104. Thereby, precoded reference signals can be transmitted from the device tester 130 to the device under test 100 using precoder matrices corresponding to the first group of active antenna ports 110, such that interference free channels (or orthogonal channels) are obtained allowing the reference signals to be received independently at each port of the first group of active antenna ports 110.

Optionally, the step 208 can comprise activating the second group of antenna ports of the beamforming network 104 of the device under test 100, while deactivating the other antenna ports of the beamforming network 104. Thereby, precoded reference signals can be transmitted from the device tester 130 to the device under test 100 using precoder matrices corresponding to the second group of active antenna ports 110, such that interference free channels (or orthogonal channels) are obtained allowing the reference signals to be received independently at each port of the second group of active antenna ports 110.

In embodiments, the step 208 can comprise characterizing the frequency response of the beamforming network using the received reference signals and using specific beamforming network operating parameters (e.g., specific values for phase-shifters and/or attenuators). For example, amplitude and/or phase measurements can be performed on the RF ports over the specified channel bandwidth, to characterize the frequency response of the beamforming network. After characterizing the frequency response of the beamforming network, the device under test 100 may optionally transmit a third signaling information (e.g., a BFN_CALIBRATION_RESPONSE message) to the device tester 130.

Subsequently, the different steps of the DUT BFN receive mode calibration are described in further detail.

In embodiments, the control site (CS) 130 may trigger the DUT 100 to calibrate its BFN 104 by sending the BFN_CALIBRATION_REQUEST (first signaling information) message to the DUT 100. When the DUT 100 is in the E-UTRA connected state and receives such a command, it enters the calibration mode and moves to step 1. Note that the DUT 100 may also initiate the BFN 104 calibration by itself (without the indication from the CS (BFN_CALIBRATION_REQUEST message)).

In embodiments, in step 1, the DUT 100 may select L (L≤P)) active array ports 110 and switch off the remaining array ports 110 of its BFN 104. The DUT 100 may set specific phases (e.g., 0°) and gains (e.g., 0 dB) to the phase-shifters and attenuators\LNAs of the BFN 104, respectively. It is assumed that each activated array port m is connected exactly to one RF port p. Hereby, it may be possible to activate a maximum of P antenna ports at the same time. In this case, we have that L=P. Note that this depends on the possible implementation of the switching block and BFN 104 realization at the DUT 100. The algorithm for selecting the L active array ports 110 and the specific settings for the phase shifters and attenuators are left up to the DUT 100 implementation (e.g. maximum gain, no attenuation, phase 0°).

For the selected m-th active DUT 100 array port 110, the DUT 100 may estimate the channel transfer matrix $\hat{H}_m(q) \in \mathbb{C}^{1 \times N}$ (for the selected frequency-bins q=1, . . . , Q) between the O CS antenna ports (O≥L) and the active m-th DUT array port using reference signals (such as the CSI-RS (BS-UE link) or SRS (UE-BS link)) sent by the CS 130 over the N OTA illumination antennas 132.

If the maximum number of different reference signals or CS ports 134 is smaller than N a sequential switching regime may be applied for the measurement of the N channels in $\hat{H}_m(q)$.

The channel transfer matrix $\hat{H}_m(q)$ is composed of the anechoic\non-anechoic environment's 120 propagation characteristic $H_m(q) \in \mathbb{C}^{1 \times O}$ including the DUT antenna 102, OTA antenna 132 responses and the frequency-dependent DUT's 100 BFN 104 characteristic $f_m(q) \in \mathbb{C}$, $$\hat{H}_m(q) = f_m(q) H_m(q), \; q=1, \ldots, Q. \quad (1)$$

The above procedure (Step 1) can be repeated for all groups of DUT array ports 110 that need to be calibrated. After the channel measurements/estimation, the DUT 100 may have full knowledge of all channels between the O CS antenna ports 134 and the M DUT array ports 110. The channel transfer matrices between the O CS antenna ports 134 and M DUT array ports 110 are given by $$\hat{H}(q) = F_{cal}(q)[H_1^H(q), H_2^H(q), \ldots, H_M^H(q)]^H,$$
$$q=1, \ldots, Q. \quad (2)$$

where $F_{cal}(q)$, q=Q are diagonal matrices containing the DUT's BFN 104 coefficients for the chosen setting with $f_m(q)$, m=1, . . . , M, $$F_{cal}(q) = \begin{bmatrix} f_1(q) & 0 & 0 \\ 0 & \ddots & 0 \\ 0 & 0 & f_M(q) \end{bmatrix}. \quad (3)$$

When the above procedure is finished, the DUT 100 may generates a report (BFN_CALIBRATION_RESPONSE message) containing information about the measured MIMO channel matrices in (2), and sends them via an uplink session to the CS 130.

In embodiments, in step 2, the DUT 100 may requests a signal-precoded transmission (OTA_PRECODING_REQUEST message (second signaling information)) by the CS 130 such that the DUT may perform calibration of its BFN 104. As the number of DUT 100 array ports 110 may be larger than the number of CS antenna ports 134, the DUT 100 may inform the CS 130 about the actual DUT 100 array ports 110 (OTA_PRECODING_REQUEST message) to be involved in the current DUT BFN calibration step. Note that the number of these DUT array ports 110 may have to be smaller or equal than the number of CS antenna ports 134. When the CS 130 receives such a request, it may calculate a set of precoder matrices P(q), q=1, . . . , Q based on the channel transfer matrices $\hat{H}(q)$, q=1, . . . , Q for the involved DUT array ports 110. There exist a variety of approaches for signal precoding. As an example, the precoder matrices can be calculated by the Moore-Penrose pseudo-inverse of the channel transfer matrices [148,149], $$P(q) = c(q)\hat{H}^+(q), \; q=1, \ldots, Q, \quad (4)$$

where c(q) is a scalar to meet a specific power constraint.

The precoder matrices can be applied at the CS 130 to the reference sequences sent over O CS antenna ports 134/N OTA antennas 132. The aim of the signal precoding at the CS 130 is to create an interference-free downlink channel allowing the reference signals sent by the CS 130 to be received independently at each DUT array port 110. After applying the precoder matrices to the reference signals, the CS 130 may inform the DUT 100 by sending an OTA_PRECODING_RESPONSE message indicating that the DUT 100 may start the calibration of its BFN 104.

In embodiments, in step 3, the calibration of the BFN 104 for the selected DUT 100 array ports 110 occurs in the second stage. The DUT 100 may select the involved array ports 110 in the calibration, switches off remaining array ports and sets specific values to the phase-shifters and attenuators of its BFN 104 with respect to a specific calibration procedure. Note that the involved DUT array ports 110 are advantageously identical to the selected DUT array ports 110 from Step 2.

For each setting, the DUT 100 may perform amplitude and phase measurements on the RF ports 112 over the specified channel bandwidth to characterize the frequency response of the BFN 104. Note that the detailed steps of the calibration procedure (settings of specific phase and gain values) are left up on the DUT 100 implementation. The measurement period that is used to determine the frequency response of the BFN 104 depends also on the DUT 100 implementation.

When DUT 100 has finished the measurements, it may send a BFN_CALIBRATION_RESPONSE message to the CS 130 containing information about the current calibration step. Moreover, it may send a request to the CS 130 to change the precoder matrices such that calibration of remaining DUT array ports 110 can be performed. (see Step 2).

In embodiments, the CS 130 may inform the DUT on the selected active array ports and the settings for the phase shifters and attenuators during Step 1.

In embodiments, the CS 130 may send a request to the DUT 100 to re-estimate the channel transfer matrices for selected antenna ports with a different setting for the phase shifters and attenuators of the DUT BFN 104 in Step 1. In this way saturation effects of the LNAs may be reduced and an improved isolation between the different transmission streams may be achieved when applying the channel inverse in (4).

In embodiments, the selection of the optimal DUT 100 orientation can be included in the above procedure as well. The CS 130 can request to change the DUT 100 orientation (if possible and sends a control command to the DUT positioner) to improve the isolation between transmit streams and to avoid nulls in the antenna patterns.

In embodiments, the CS 130 may request the DUT 100 to selectively switch off antenna ports 110 and to set specific gain and phase values to the attenuators and phase-shifters of the BFN 104, respectively, during Step 1.

Figure 10:
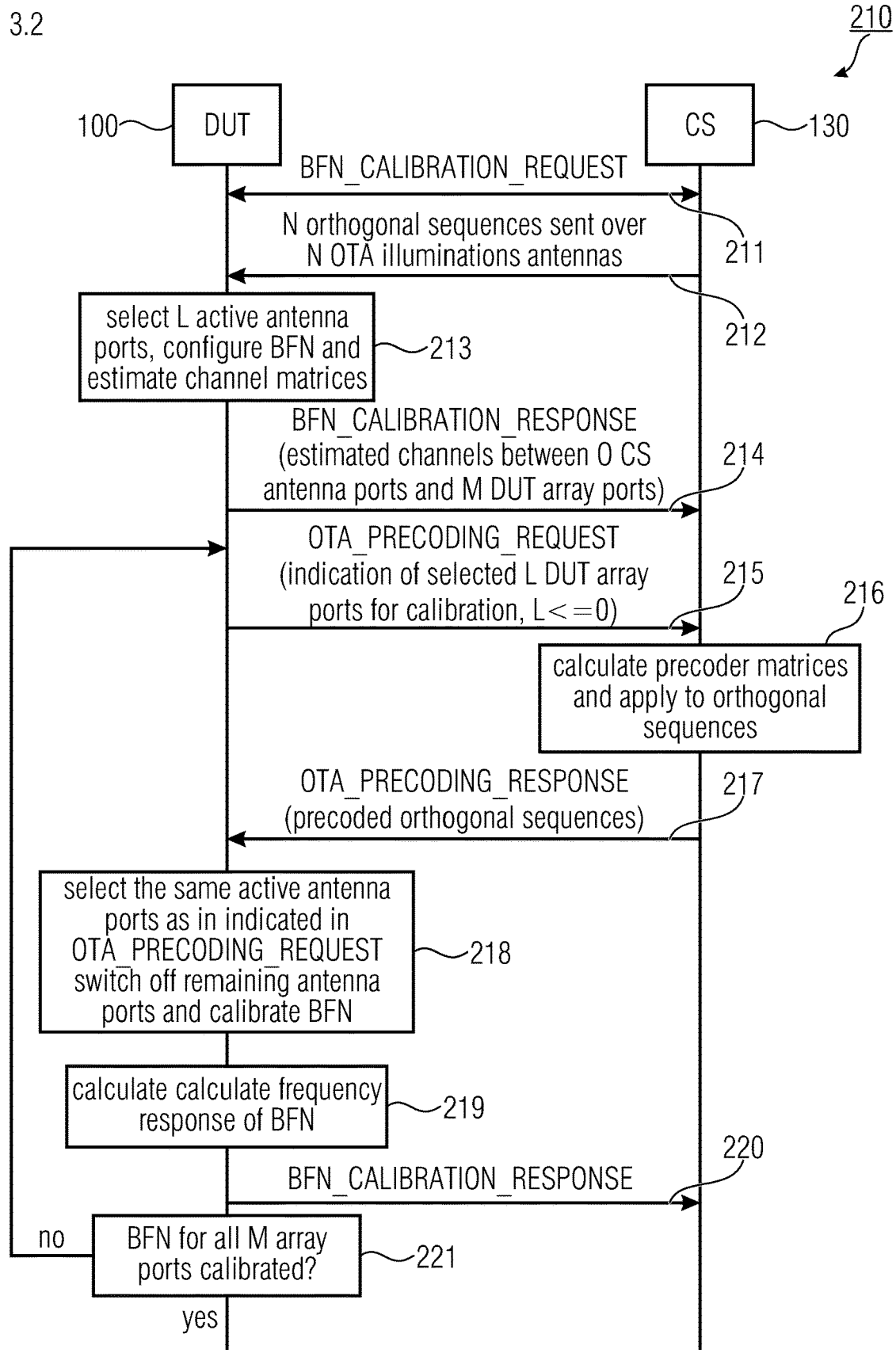
FIG. 10 shows a flowchart of a method for a DUT BFN receive mode calibration, according to an embodiment.

FIG. 10 shows a flowchart of a method 210 for a DUT BFN receive mode calibration. In a first step 211, the first signaling information (e.g., BFN_CALIBRATION_REQUEST message) can be transmitted from the DUT 100 to the CS 130, or from the CS 130 to the DUT 100. In a second step 212, N orthogonal sequences can be sent over N OTA illumination antennas 132 from the CS 130 to the DUT 100. In a third step 213, the DUT 100 may select L active antenna ports 110, configure its BFN 104 and estimate the channel matrices. In a fourth step 214, the DUT 100 may transmit the BFN_CALIBRATION_RESPONSE message with the estimated channels between O CS antenna ports 215 and M DUT array ports 110 to the CS 130. In a fifth step 135, the DUT 100 may transmit the second signaling information (e.g., OTA_PRECODING_REQUEST message) indicating the selected L DUT array ports 110 for calibration with L<=0 to the CS 130. In a sixth step 216, the CS 130 may calculate precoder matrices and apply same to orthogonal sequences. In a seventh step 217, the CS 130 may transmit the OTA_PRECODING_RESPONSE message and the pre-coded orthogonal sequences to the DUT 100. In an eight step 218, the DUT 100 may select the same active antenna ports as indicated in the second signaling information (e.g., OTA_PRECODING_REQUEST message) and switch off the remaining antenna ports and calibrate its BFN 103. In a ninth step 219, the BFN 100 may calculate the frequency response of its BFN 104. In a tenth step 220, the DUT 100 may transmit the BFN_CALIBRATION_RESPONSE message to the CS 130. In an eleventh step 221, the DUT 100 may determine whether its BFN 104 is calibrated for all M array ports 110. If the BFN 104 is calibrated for all M array ports 110, then calibration/testing is finished, else steps five to eleven are repeated.

DUT BFN Transmit Mode Calibration

Figure 11:
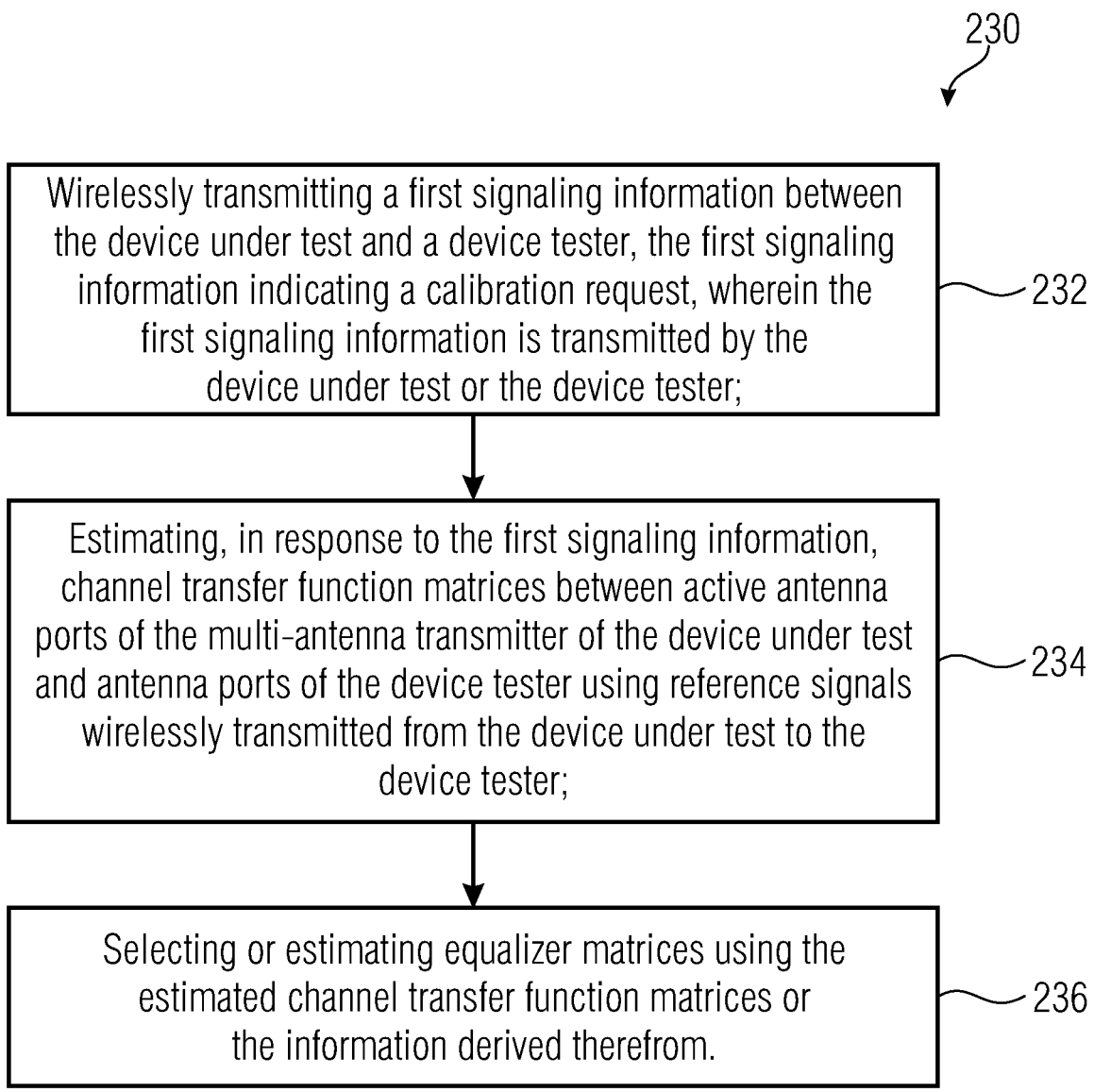
FIG. 11 shows a flowchart of a method for wirelessly calibrating/testing a beamforming network of a multi-antenna transmitter of a device under test, according to an embodiment.

FIG. 11 shows a flowchart of a method 230 for wirelessly calibrating/testing a beamforming network of a multi-antenna transmitter of a device under test 100, according to an embodiment. For example, the method 230 may be used for calibrating/testing components (i.e., the beamforming network 104) of the multi-antenna transmitter upstream (in transmit direction) antenna ports 110 of the multi-antenna transmitter.

The method 230 comprises a step 232 of wirelessly transmitting a first signaling information between the device under test 100 and a device tester 130, the first signaling information indicating a calibration request, wherein the first signaling information is transmitted by the device under test 100 or the device tester 130.

For example, the calibration request can be initiated by the device under test 100 itself. In this case, the device under test 100 may transmit the first signaling information with the calibration request to the device tester 130. Alternatively, the calibration request can be initiated by the device tester 130. In this case, the device tester 130 may transmit the first signaling information with the calibration request to the device under test 100 which receives the first signaling information. The device under test 100 may switch into a calibration mode (different from a normal operation mode) upon transmitting or receiving the first signaling information.

For example, the first signaling information can be a BFN_CALIBRATION_REQUEST message.

In embodiments, the step 232 can comprise wirelessly transmitting a second signaling information (e.g., BFN_CALIBRATION_RESPONSE message) between the device under test 100 and a device tester 130, wherein the BFN_CALIBRATION_RESPONSE message transmitted by the device under test 100 or the device tester 130. The BFN_CALIBRATION_RESPONSE message can indicate parameters to be used in the following steps, such as a useful measurement accuracy, a configuration of the beamforming network, a number of antenna ports of the device under test 100 and/or a number of antenna ports 134 of the device tester.

Further, the method 230 comprises a step 234 of estimating, in response to the first signaling information, channel transfer function matrices between active antenna ports 110 of the multi-antenna transmitter of the device under test and antenna ports 134 of the device tester using reference signals wirelessly transmitted from the device under test 100 to the device tester 130.

For example, the reference signals can be transmitted together with a BFN_CALIBRATION_START message indicating a start of the calibration from the device under test 100 to the device tester 110.

In embodiments, the step 234 can comprise connecting each active antenna port 110 of the beamforming network 104 to exactly one RF port 112 of beamforming network for estimating the channel transfer function matrices.

In embodiments, the step 234 can comprise activating a first group of antenna ports of the beamforming network 104 of the device under test 100, to obtain the active antenna ports, while deactivating the other antenna ports of the beamforming network 104. Thus, channel transfer function matrices describing the channels between the first group of active antenna ports and the antenna ports 134 of the device tester 130 are obtained.

Optionally, the step 234 can comprise activating a second group of antenna ports 110 of the beamforming network 104 of the device under test 100, while deactivating the other antenna ports of the beamforming network 104, and estimating channel transfer function matrices between the second group of antenna ports of the device under test 100 and antenna ports 134 of the device tester using reference signals wirelessly transmitted from the device under test 100 to the device tester 130, to obtain channel transfer function matrices describing channels between the second group of active antenna ports 110 and the antenna ports 134 of the device tester 130.

In embodiments, the step 234 can comprise wirelessly transmitting a third signaling information from the device tester 130 to the device under test 100, the third signaling information indicating that the estimation of the channel transfer function matrices is finished.

For example, the third signaling information can be a BFN_CALIBRATION_FINISHED message.

Further, the method 230 comprises the step 236 of selecting or estimating equalizer matrices using the estimated channel transfer function matrices or the information derived therefrom.

In embodiments, the step 236 can comprise wirelessly transmitting a fourth signaling information from the device under test 100 to the device tester 130, the fourth signaling information indicating a calibration data request, wherein the equalizer matrices or the information derived therefrom is transmitted from the device tester 130 to the device under test 100 in response to the fourth signaling information.

For example, the fourth signaling information can be a BFN_CALIBRATION_DATA_REQUEST message. Further, the equalizer matrices or the information derived therefrom can be transmitted from the device tester 130 to the device under test 100 using a BFN_CALIBRATION_DATA_RESPONSE message.

Subsequently, the different steps of the DUT BFN transmit mode calibration are described in further detail.

In embodiments, the CS 130 may send a BFN 104 calibration request message (BFN_CALIBRATION_REQUEST message (first signaling information)) to the DUT 100. The message may contain information about the CS antenna port 134 configuration. Alternatively, the BFN calibration may be triggered directly by the DUT 100 by sending the BFN_CALIBRATION_REQUEST message to the CS 130. Either the DUT 100 or the CS 130 initiate the DUT calibration, the following calibration information may be signaled (using the BFN_CALIBRATION_REQUEST message and/or a BFN_CALIBRATION_RESPONSE message) between the CS 130 and DUT 100. For example, the calibration information may include a useful measurement accuracy that has to be fulfilled per measurement by the CS 130. Further, the calibration information may include a BFN configuration (number of links between P and M, number of possible settings per link e.g. number of attenuator steps, phase shifter steps, PA gain steps). Further, the calibration information may include a number of antenna ports 110,134 at DUT 100 and CS 130. Further, the calibration information may include a channel bandwidth (note that it is typically the intention to measure the BFN frequency response using fully allocated channels (measurement of CSI-RS or SRS across the entire channel bandwidth)).

In embodiments, the DUT 100/CS 130 may receive the BFN_CALIBRATION_RESPONSE message, wherein the DUT 100 and CS 130 can perform the following steps.

In embodiments, e.g., in a first step, the DUT 100 may select for each measurement u (u=1, . . . , U) a number L of active array ports 110 and switches off the remaining array ports 110. Each activated array port is now connected exactly to one RF port 112. The DUT 100 may configure the BFN 104 with specific phase and gain values. The selection of array ports and BFN settings (phase and gain values) is left up to the DUT 100 implementation.

In embodiments, e.g., in a second step, after the configuration of the BFN 104, the DUT 100 may send reference sequences on the activated DUT array ports 110 and send a BFN_CALIBRATION_START message (containing the labeling of activated DUT array ports for the specific measurement) to the CS 130.

In embodiments, e.g., in a third step, the CS 130 may perform measurements on the received sequences sent from the DUT 100 and estimate the wideband channel matrix between the L activated DUT array ports 110 and the O CS antenna ports 134/N OTA antennas 132. The channel transfer matrix $\hat{T}_p(q) \in \mathbb{C}^{O \times 1}$, q=1, . . . , Q of the m-th active DUT array port is composed of the anechoic or non-anechoic chamber's propagation characteristic $T_m(q) \in \mathbb{C}^{O \times 1}$ and the frequency-dependent DUT's and OTA antenna responses and BFN 104 characteristic for the chosen setting $g_m(q) \in \mathbb{C}$ at the q-th frequency-bin, $$\hat{T}_m(q) = g_m(q) T_m(q), q=1, \ldots, Q.$$

In embodiments, e.g., in a fourth step, after the channel estimation phase, the CS 130 may send a BFN_CALIBRATION_FINISHED message to the DUT 100 signaling that the measurement for the selected setup of DUT 100 antenna ports 110 and BFN 104 setting is finished.

In embodiments, e.g., in a fifth step, when the DUT receives the BFN_CALIBRATION_FINISHED message, it optionally selects another set of active DUT array ports and BFN settings.

In embodiments, e.g., in a sixth step, steps 1 to 5 can be repeated for all DUT array ports 110 and BFN 104 settings.

In embodiments, e.g., in a seventh step, after all measurements have been completed, the DUT 100 may send a BFN_CALIBRATION_DATA_REQUEST message to the CS 130, indicating that the CS 130 shall provide the collected calibration date to the DUT 100.

In embodiments, e.g., in an eight step, when the BFN_CALIBRATION_DATA_REQUEST message, it calculates a set of equalizer matrices W(q), q=1, . . . , Q and applies them to the estimated channels. The equalizer matrices W(q), q=1, . . . , Q are based on the estimated channel matrices $\hat{T}^{(s)}(q) = G_{cal}^{(s)}(q)[T_1^{(s)H}(q), T_2^{(s)H}(q), \ldots, T_M^{(s)H}(q)]^H$, q=1, . . . , Q; between the O CS antenna ports 134 and K DUT array ports 110 (K<=O) for a specific BFN 104 configuration s (s=0, . . . , S) of RF paths, phase and gain values. Here, $G_{cal}^{(s)}(q)$, s=0, . . . , S is a diagonal matrix containing the frequency response of the BFN 104 for the specific BFN configuration s. The equalizer matrices can be calculated based on MMSE, ZF or another objective function. Note that, the equalizer needs to be calculated for a specific BFN configuration ś, ś∈(0, . . . , S) of RF paths, phase and gain values. This configuration can be selected by the CS 130 itself, or optionally may be signaled by the DUT 100 to the CS 130. The BFN calibration matrix containing the frequency response of the BFN 104 for the s-th setup is then given by $$\check{G}_{cal}^{(s)}(q) = (G_{cal}^{(ś)})^{-1}(q) G_{cal}^{(s)}(q). \qquad (6)$$

In embodiments, e.g., in a ninth step, the diagonal matrices $\check{G}_{cal}^{(s)}(q)$ can be calculated for all setups and DUT antenna ports 110 involved in the calibration and send in a report (BFN_CALIBRATION_DATA_RESPONSE message) to the DUT 100.

Figure 12:
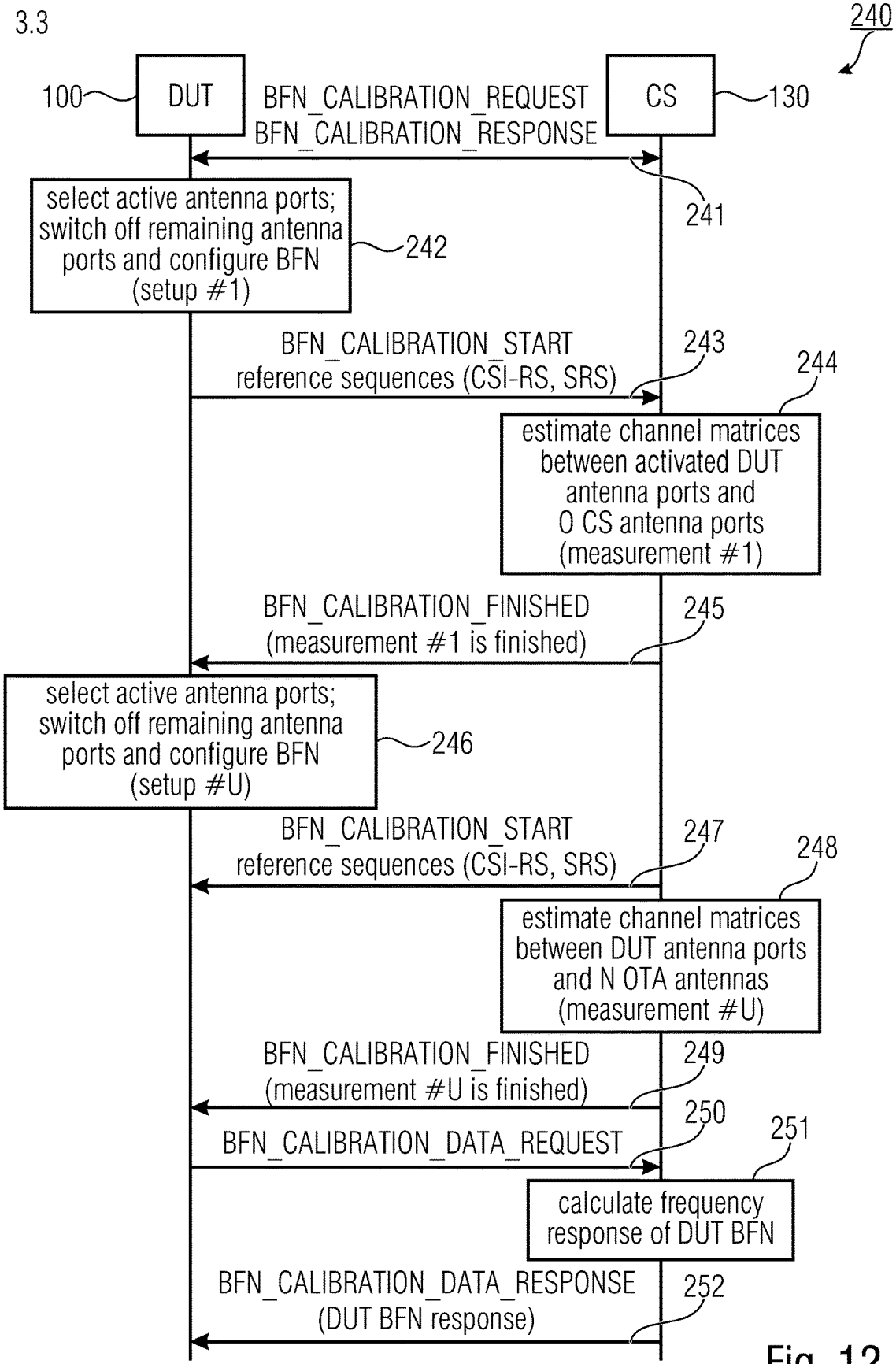
FIG. 12 shows a flowchart of a method for a DUT BFN transmit mode calibration, according to an embodiment.

FIG. 12 shows a flowchart of a method 240 for a DUT BFN transmit mode calibration. In a first step 241, the first signaling information (e.g., BFN_CALIBRATION_RE- QUEST message) can be transmitted from the DUT 100 to the CS 130, or from the CS 130 to the DUT 100. Further, in the first step 241, the second signaling information (e.g., BFN_CALIBRATION_RESPONSE message) can be transmitted from the DUT 100 to the CS 130, or from the CS 130 to the DUT 100. In a second step 242, the DUT 100 can select active antenna ports 110, switch off remaining antenna ports and configure its BFN 104. In a third step 243, the DUT can transmit a BFN_CALIBRATION_START message to the CS 130 and transmit the reference sequences (e.g., CSI-RS, SRS). In a fourth step 244, the CS 130 can estimate channel matrices between active DUT antenna ports 110 and O CS antenna ports 134 (measurement #1). In a fifth step 245, the CS 130 can transmit the third signaling information (BFN_CALIBRATION_FINISHED message) to the DUT 100. In an optional sixth step 246, the DUT 100 can select different active antenna ports 110, switch off remaining antenna ports and configure its BFN 104. In an optional seventh step 247, the DUT 100 can transmit a BFN_CALIBRATION_START message to the CS 130 and transmit the reference sequences (e.g., CSI-RS, SRS). In an optional eight step 248, the CS 130 can estimate channel matrices between the active DUT antenna ports 110 and O CS antenna ports 134 (measurement #U). In an optional ninth step 249, the CS 130 can transmit the third signaling information (BFN_CALIBRATION_FINISHED message) to the DUT 100. In a tenth step 250, the DUT 100 can transmit the fourth signaling information (BFN_CALIBRATION_DATA_REQUEST message) to the CS 130. In an eleventh step 251, the CS 130 can calculate the frequency response of the DUT BFN 104. In a twelfth step 252, the CS 130 can transmit the fifth signaling information (BFN_CALIBRATION_DATA_RESPONSE message) with the DUT BFN response to the DUT 100.

DUT Rx Module Calibration/Testing

Figure 13:
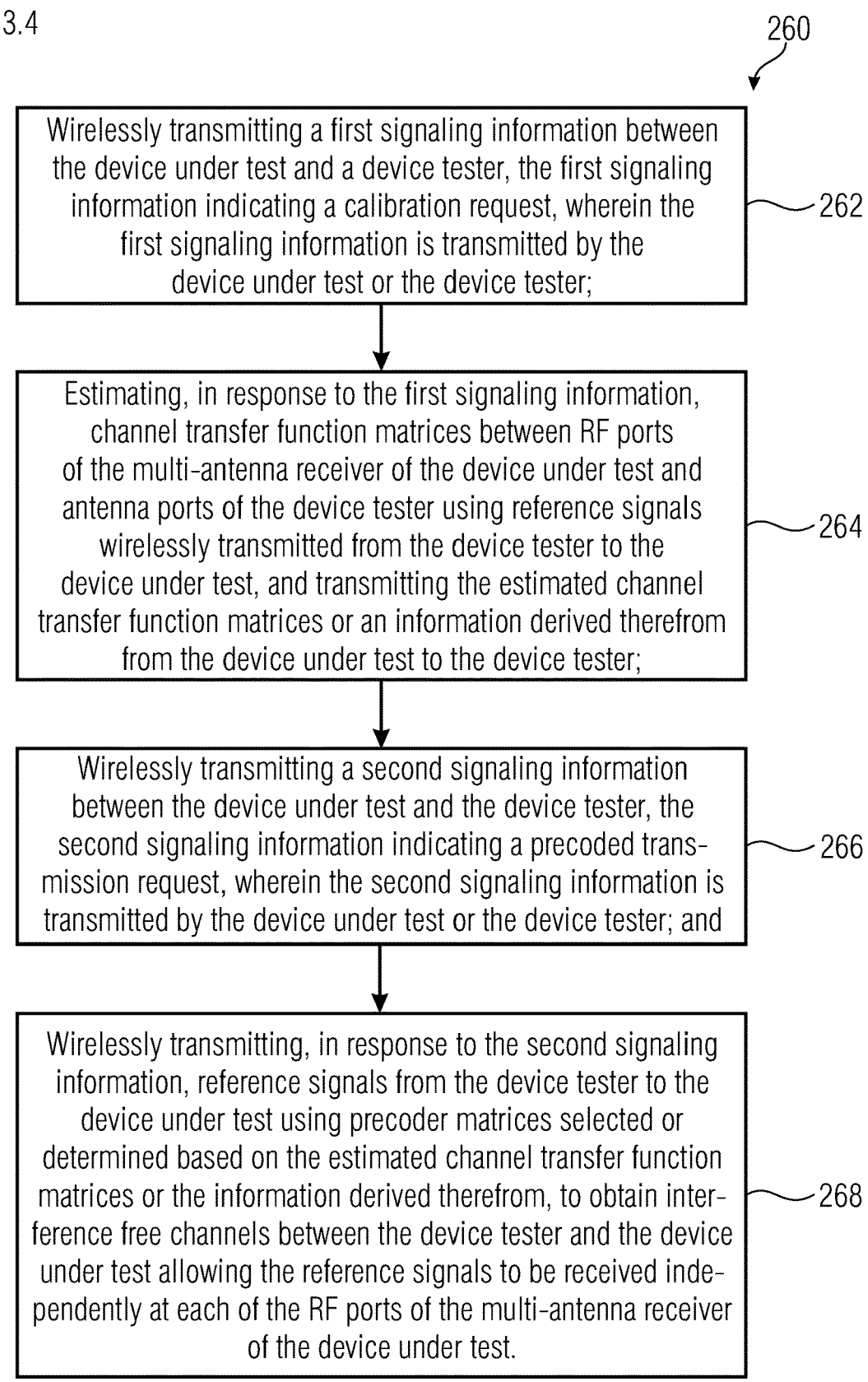
FIG. 13 shows a flowchart of a method for wirelessly calibrating/testing a receive module of a multi-antenna receiver of a device under test, according to an embodiment.

FIG. 13 shows a flowchart of a method 260 for wirelessly calibrating/testing a receive module of a multi-antenna receiver of a device under test 100, according to an embodiment. For example, the method 260 may be used for calibrating/testing components (i.e., the receive module 106) of the multi-antenna receiver downstream (in receive direction) RF ports 112 of the multi-antenna receiver.

The method 260 comprises a step 262 of wirelessly transmitting a first signaling information between the device under test and a device tester, the first signaling information indicating a calibration request, wherein the first signaling information is transmitted by the device under test or the device tester.

For example, the calibration request can be initiated by the device under test 100 itself. In this case, the device under test 100 may transmit the first signaling information with the calibration request to the device tester 130. Alternatively, the calibration request can be initiated by the device tester 130. In this case, the device tester 130 may transmit the first signaling information with the calibration request to the device under test 100 which receives the first signaling information. The device under test 100 may switch into a calibration mode (different from a normal operation mode) upon transmitting or receiving the first signaling information.

For example, the first signaling information can be a DUT_RX_CHANNEL_MEASURMENT_REQUEST message.

Further, the method 260 comprises a step 264 of estimating, in response to the first signaling information, channel transfer function matrices between RF ports 112 of the multi-antenna receiver of the device under test 100 and antenna ports 134 of the device tester 130 using reference signals wirelessly transmitted from the device tester 130 to the device under test 100, and transmitting the estimated channel transfer function matrices or an information derived therefrom from the device under test 100 to the device tester 130.

For example, the estimated channel transfer function matrices or the information derived therefrom can be transmitted to the device tester 130 using a DUT_RX_CHANNEL_MEASURMENT_RESPONSE message.

In embodiments, the step 264 can comprise activating a group of antenna ports of the beamforming network 104 of the device under test 100, to obtain the active antenna ports, while deactivating the other antenna ports of the beamforming network 104. Further, the step 264 can comprise connecting the active antenna ports 110 to the RF ports 112.

In embodiments, the step 264 can further comprise setting specific beamforming network operating parameters, such as values for the phase shifters and attenuators of the beamforming network.

Further, the method 260 comprises a step 266 of wirelessly transmitting a second signaling information between the device under test 100 and the device tester 130, the second signaling information indicating a precoded transmission request, wherein the second signaling information is transmitted by the device under test 100 or the device tester 130.

For example, the second signaling information can be RECEIVER_SENSITIVITY_MEASUREMENT message.

Further, the method 260 comprises a step 268 of wirelessly transmitting, in response to the second signaling information, reference signals from the device tester to the device under test using precoder matrices selected or determined based on the estimated channel transfer function matrices or the information derived therefrom, to obtain interference free channels between the device tester and the device under test allowing the reference signals to be received independently at each of the RF ports of the multi-antenna receiver of the device under test.

In embodiments, the step 268 can comprise measuring metrics specifying the performance of the device under test 100.

Subsequently, the different steps of the DUT Rx module calibration/testing are described in further detail.

In embodiments, e.g., in a first step, the DUT 100/CS 130 may send a receiver testing request (DUT_RX_CHANNEL_MEASUREMENT_REQUEST message) to the CS 130/DUT 100.

In embodiments, e.g., in a second step, the DUT 100 can configure its BFN 104, select a number of active DUT array ports 100 and set values for the phase shifters and attenuators of its BFN 104 (it is not required that each array port (m) is now connected to a single RF port (p)).

In embodiments, e.g., in a third step, the DUT 100 can perform measurements on the received reference sequences (e.g. CSI_RS or SRS sequences) sent by the CS 130 to estimate the channel matrices D(q) between the O CS antenna ports 100 and the P RF ports 112 of the DUT 100. The estimated channel matrices are given by $\hat{D}(q)=B(q)H(q)$, $q=1, \ldots, Q$, where $B(q) \in \mathbb{C}^{P \times O}$ is the frequency response of the BFN 104 at the q-th frequency bin with P being the number of activated RF ports (P≤M) 112.

In embodiments, e.g., in a fourth step, the DUT 100 can generate a report (DUT_RX_CHANNEL_MEASUREMENT_RESPONSE message) containing information about the measured multi-antenna channel matrices in $\hat{D}(q)$, $q=1, \ldots, Q$ and sends them via an uplink session to the CS.

In embodiments, e.g., in a fifth step, the CS 130 can calculate a set of precoder matrices $P(q), q=1, \ldots, Q$ based on the received channel transfer matrices $\hat{D}(q), q=1, \ldots, Q$ from the DUT 100. The precoder matrices can be applied to the transmitted signals at the CS 130 with the aim to create an equivalent ideally interference-free rank-P downlink channel allowing the (precoded) transmitted signals from the CS 130 to be received independently at each DUT RF port 112.

In embodiments, e.g., in a sixth step, after performing the signal precoding at the CS 130, the CS 130/DUT 100 may request the measurement of certain performance metrics by the DUT 100. The DUT 100 has to set the BFN 104 as in the second step and the remaining components of the DUT 100 can be running as in standard operation mode. Several metrics specifying the performance of the DUT 100 can be measured, such as throughput, CQI, BLER, etc. Furthermore, the CS 130 can change the transmit power, modulation scheme or any other parameter to measure the impact on the performance of the DUT 100. For example, the DUT 100 measures the P RSSIs (received signal strength indicators) and send them back to the CS 130. The CS 130 may reduce step-wise the transmit power after receiving P measured RSSIs from the DUT 100 corresponding to a certain transmit power (RECEIVER_SENSITIVITY_MEASUREMENT).

DUT Tx Module Calibration/Testing

Figure 14:
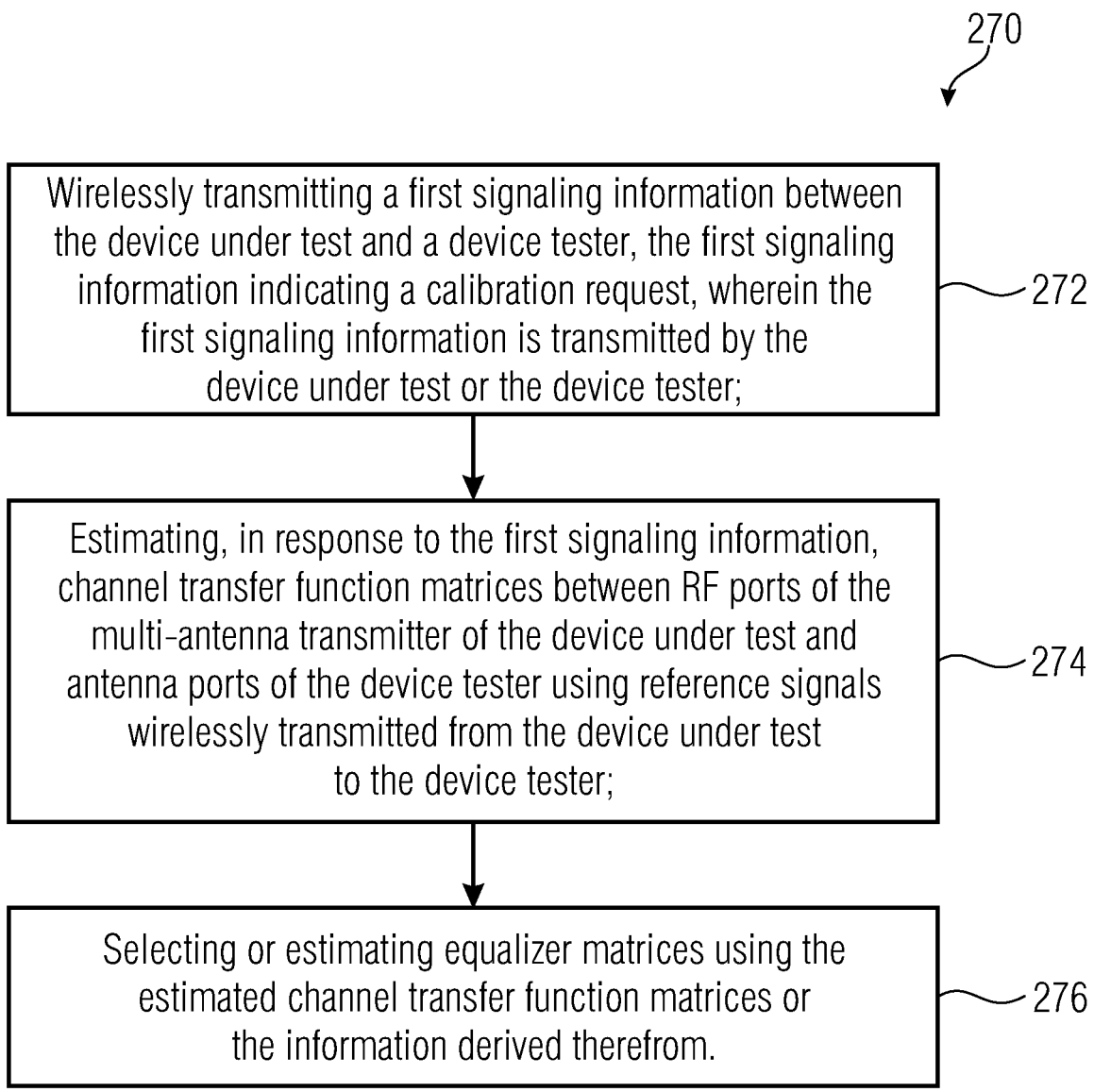
FIG. 14 shows a flowchart of a method for wirelessly calibrating/testing a transmit module of a multi-antenna transmitter of a device under test, according to an embodiment.

FIG. 14 shows a flowchart of a method 270 for wirelessly calibrating/testing a transmit module of a multi-antenna transmitter of a device under test 100, according to an embodiment. For example, the method 270 may be used for calibrating/testing components (i.e., the transmit module 106) of the multi-antenna transmitter upstream (in transmit direction) RF ports 112 of the multi-antenna receiver.

The method 270 comprises a step 272 of wirelessly transmitting a first signaling information between the device under test 100 and a device tester 130, the first signaling information indicating a calibration request, wherein the first signaling information is transmitted by the device under test 100 or the device tester 130.

For example, the calibration request can be initiated by the device under test 100 itself. In this case, the device under test 100 may transmit the first signaling information with the calibration request to the device tester 130. Alternatively, the calibration request can be initiated by the device tester 130. In this case, the device tester 130 may transmit the first signaling information with the calibration request to the device under test 100 which receives the first signaling information. The device under test 100 may switch into a calibration mode (different from a normal operation mode) upon transmitting or receiving the first signaling information.

For example, the first signaling information can be a DUT_TX_CHANNEL_MEASUREMENT_REQUEST message.

Further, the method 270 comprises a step 274 of estimating, in response to the first signaling information, channel transfer function matrices between RF ports 112 of the multi-antenna transmitter of the device under test 100 and antenna ports 134 of the device tester 130 using reference signals wirelessly transmitted from the device under test 100 to the device tester 130.

For example, the estimated channel transfer function matrices or the information derived therefrom can be transmitted to the device tester 130 using a second signaling information (DUT_RX_CHANNEL_MEASURMENT_RESPONSE message).

In embodiments, the step 274 can comprise activating a group of antenna ports of the beamforming network 104 of the device under test 100, to obtain the active antenna ports, while deactivating the other antenna ports of the beamforming network 104. Further, the step 274 can comprise connecting the active antenna ports 110 to the RF ports 112.

In embodiments, the step 274 can further comprise setting specific beamforming network operating parameters, such as values for the phase shifters and attenuators of the beamforming network.

Further, the method 270 comprises a step 272 of selecting or estimating equalizer matrices using the estimated channel transfer function matrices or the information derived therefrom.

In embodiments, the method 270 can further comprise measuring metrics specifying the transmit performance of the device under test (e.g., throughput, CQI, BLER) using the selected or estimated equalizer matrices.

Subsequently, the different steps of the DUT Tx module calibration/testing are described in further detail.

In embodiments, e.g., in a first step, the DUT 100/CS 130 may send a transmitter testing request (DUT_TX_CHANNEL_MEASUREMENT_REQUEST message) to the CS/DUT.

In embodiments, e.g., in a second step, the DUT 100 can configure its BFN 104 and select the active DUT array ports (it is not required that an array port (m) is exactly connected to only one RF port (p)).

In embodiments, e.g., in a third step, the DUT 100 can send reference sequences on its P RF ports 112.

In embodiments, e.g., in fourth step, the CS 130 can performs measurements on the received sequences sent from the DUT 100 and estimates the wideband channel matrix $U(q)$ between the P RF ports 112 and the O CS antenna ports 134/N OTA antenna ports. The estimated channel matrices are given by $\hat{U}(q)=B(q)H(q), q=1, Q$, where $B(q) \in \mathbb{C}^{P \times O}$ is the frequency response of the BFN 104 at the q-th frequency bin with P being the number of activated RF ports (P≤M) 112.

In embodiments, e.g., in a fifth step, after the channel estimation phase, the CS 130 can send a DUT_RX_CHANNEL_MEASUREMENT_RESPONSE message to the DUT 100 signaling that the measurements are finished.

In embodiments, e.g., in a sixth step, the CS 130 can calculate a set of equalizer matrices $W(q), q=1, Q$ based on the estimated channels $\hat{U}(q)$ and applies them to the received signals.

In embodiments, e.g., in a seventh step, the DUT 100/CS 130 may then request the measurement of certain performance metrics by the CS 130. The DUT 100 has to set the BFN 104 as in step 2 and the remaining components of the DUT 100 can run as in standard operation mode. Several metrics specifying the performance of the DUT 100 can be measured at the CS 130, such as throughput, CQI, BLER, etc. Furthermore, the CS 130 may request to change the Tx power of the DUT 100, modulation scheme or any other parameter to measure the impact on the performance of the DUT 100.

DUT Rx/Tx Antenna Calibration in an Anechoic Chamber

Figure 15:
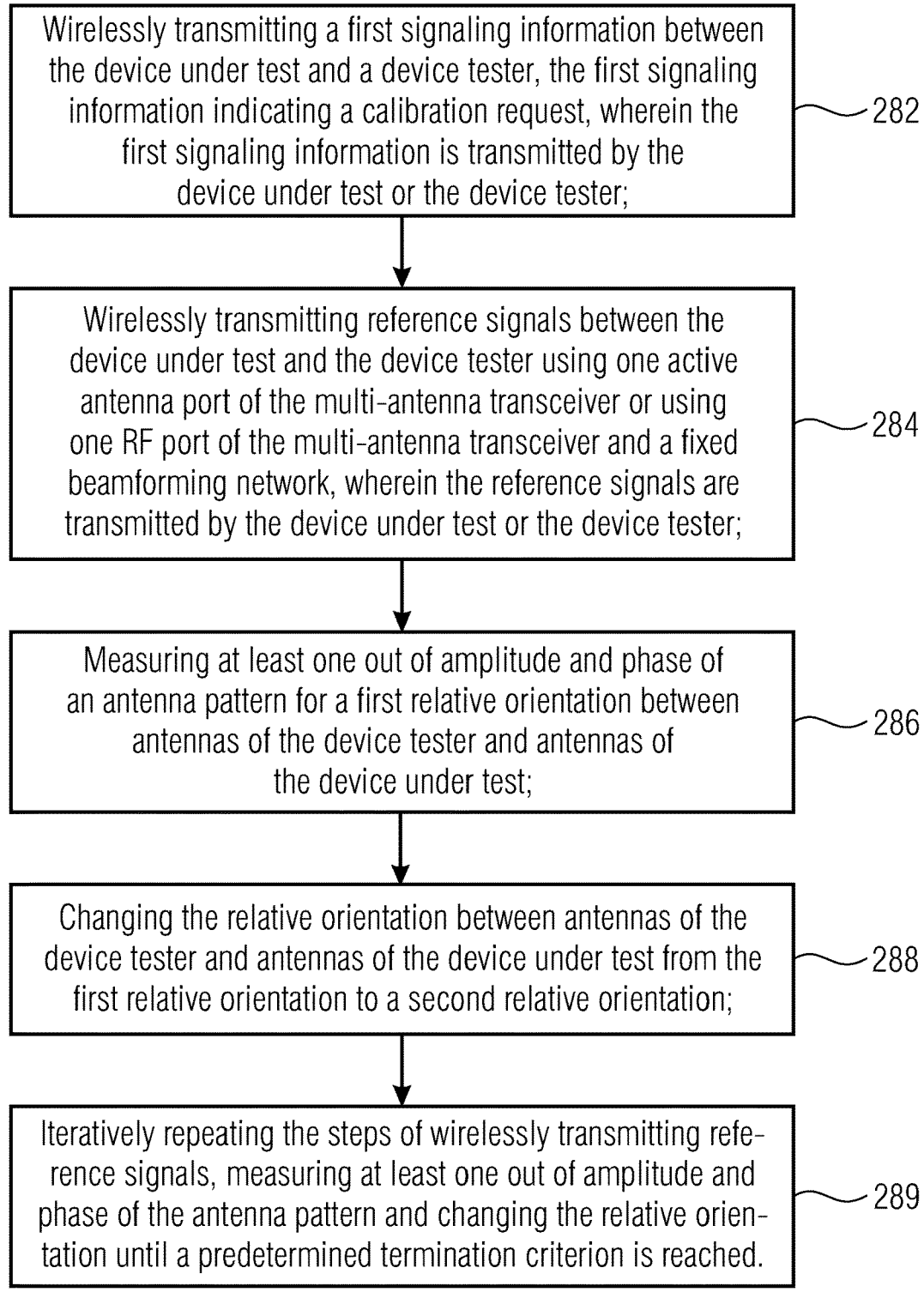
FIG. 15 shows a flowchart of a method for wirelessly calibrating/testing antennas of a multi-antenna transceiver of a device under test, according to an embodiment.

FIG. 15 shows a flowchart of a method 280 for wirelessly calibrating/testing antennas 110 of a multi-antenna transceiver of a device under test 100, according to an embodiment. For example, the method 280 may be used for calibrating/testing components (i.e., the antennas) of the multi-antenna transceiver downstream (in transmit direction) or upstream (in receive direction) the antenna ports of the multi-antenna receiver.

The method 280 comprises a step 282 of wirelessly transmitting a first signaling information between the device under test 100 and a device tester 130, the first signaling information indicating a calibration request, wherein the first signaling information is transmitted by the device under test 100 or the device tester 130.

For example, the calibration request can be initiated by the device under test 100 itself. In this case, the device under test 100 may transmit the first signaling information with the calibration request to the device tester 130. Alternatively, the calibration request can be initiated by the device tester 130. In this case, the device tester 130 may transmit the first signaling information with the calibration request to the device under test 100 which receives the first signaling information. The device under test 100 may switch into a calibration mode (different from a normal operation mode) upon transmitting or receiving the first signaling information.

Further, the method 282 comprises a step of wirelessly transmitting reference signals between the device under test 100 and the device tester 130 using one (e.g., exactly one) active antenna port 110 of the multi-antenna transceiver or using one RF port 112 of the multi-antenna transceiver and a fixed beamforming network, wherein the reference signals are transmitted by the device under test 100 or the device tester 130.

Further, the method 280 comprises a step 286 of measuring at least one out of amplitude and phase of a antenna pattern for a first relative orientation between antennas of the device tester and antennas of the device under test. For example, the step 286 can comprise measuring the amplitude and phase of the full polarimetric antenna pattern for a first orientation.

Further, the method 280 comprises a step 288 of changing the relative orientation between antennas 102 of the device under test 100 and antennas 132 of the device tester 130 to a second relative orientation.

Further, the method 280 comprises a step 289 of iteratively repeating the steps of wirelessly transmitting reference signals, measuring at least one out of amplitude and phase of the antenna pattern (e.g., the amplitude and phase of the full polarimetric antenna pattern) and changing the relative orientation until a predetermined termination criterion is reached.

In embodiments, the method 280 can further comprise wirelessly transmitting a second signaling information from the device under test 100 to the device tester 130, the second signaling information indicating a number of antenna ports 110 or RF ports 112 to be measured.

In embodiments, the method 280 can further comprise wirelessly transmitting a third signaling information from the device tester 130 to the device under test 100, the third signaling information indicating a measured antenna pattern.

Subsequently, the different steps of the DUT Rx/Tx antenna calibration in an anechoic chamber are described in further detail.

In embodiments, similar to the DUT BFN receive mode calibration and DUT BFN transmit mode calibration, the BFN is fixed to one active antenna port 110 or one active RF port 112 with a fixed BFN (e.g. Buttler matrix).

In embodiments, e.g., in a first step, an antenna port calibration request (resolution in angle or number of steps I) can be initiated by the DUT 100 or CS 130.

In embodiments, e.g., in a second step, the DUT 100 can feed back a number of M or P ports to be measured.

In embodiments, e.g., in a third step, the CS 130/DUT 100 can start sending wideband reference sequences (e.g. CSI-RS, SRS).

In embodiments, e.g., in fourth step, the DUT 100 can send back the measured response of i-th step.

In embodiments, e.g., in fifth step, the third and fourth steps can be repeated after a positioner is set from CS 130 to a new angle and polarization.

In embodiments, e.g., in a sixth step, the CS 130 can feedback the complete antenna pattern as pattern or EADF.

Figure 16:
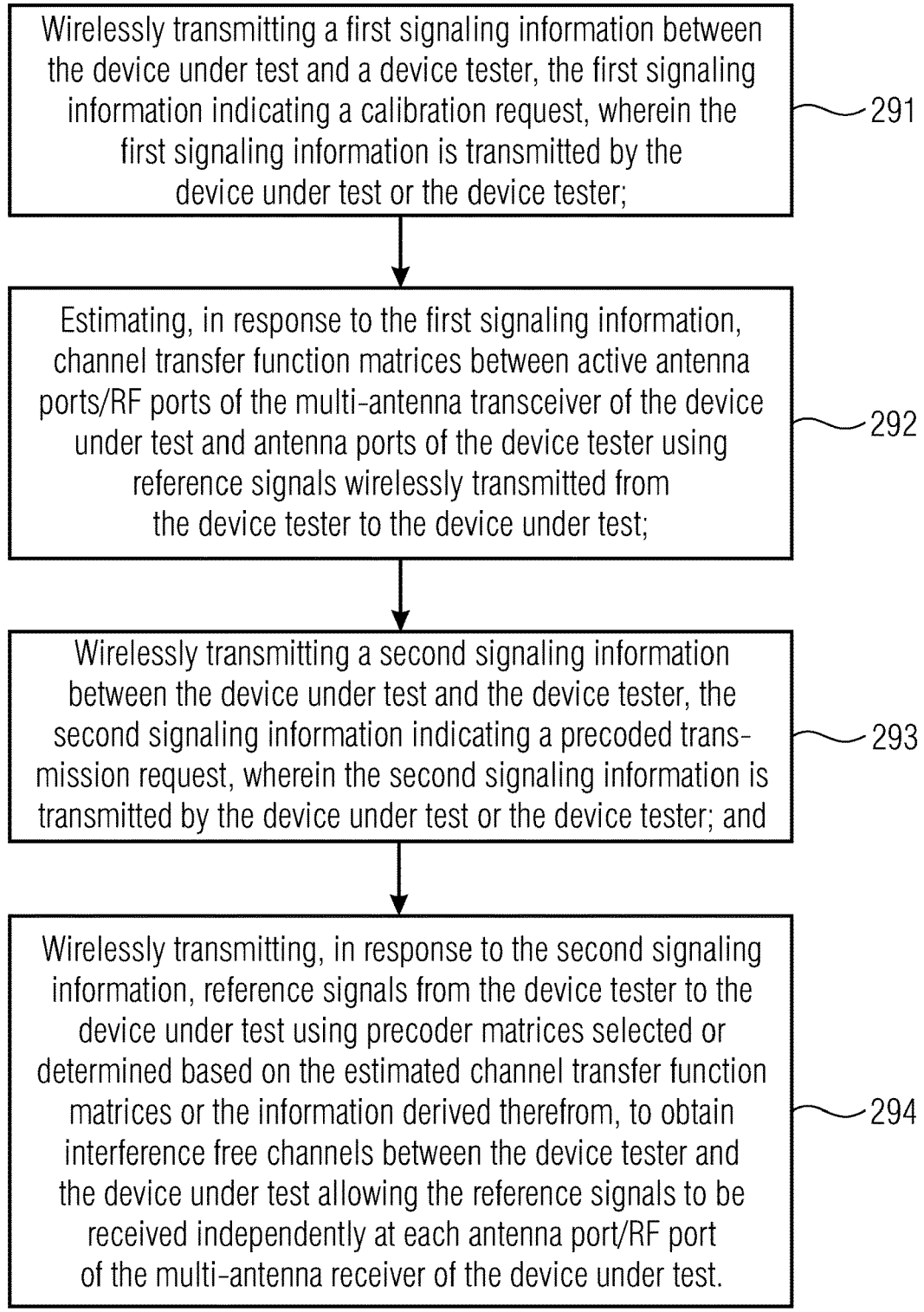
FIG. 16 shows a flowchart of a method for wirelessly calibrating/testing a digital receiver module of a multi-antenna receiver of a device under test, according to an embodiment.
Figure 17:
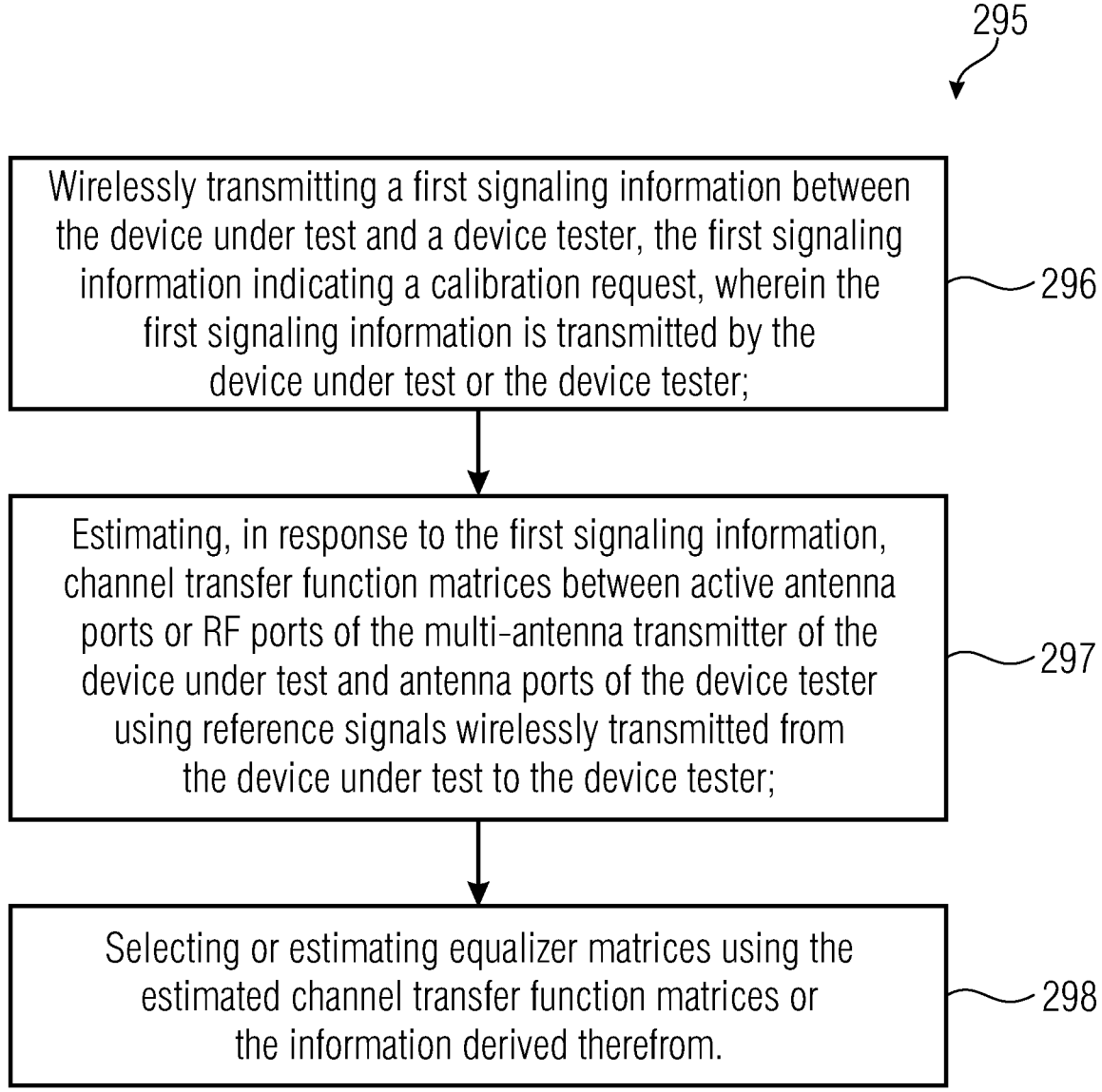
FIG. 17 shows a flowchart of a method for wirelessly calibrating/testing a digital transmitter module of a multi-antenna transmitter of a device under test, according to an embodiment.

DUT BFN Test (Digital Part) in Non-Anechoic Chamber\Static Propagation Environment FIG. 16 shows a flowchart of a method 290 for wirelessly calibrating/testing the digital portion of a device under test 100, according to an embodiment.

The method 290 comprises a step 291 of wirelessly transmitting a first signaling information between the device under test 100 and a device tester 130, the first signaling information indicating a calibration request, wherein the first signaling information is transmitted by the device under test 100 or the device tester 130.

For example, the calibration request can be initiated by the device under test 100 itself. In this case, the device under test 100 may transmit the first signaling information with the calibration request to the device tester 130. Alternatively, the calibration request can be initiated by the device tester 130. In this case, the device tester 130 may transmit the first signaling information with the calibration request to the device under test 100 which receives the first signaling information. The device under test 100 may switch into a calibration mode (different from a normal operation mode) upon transmitting or receiving the first signaling information.

For example, the first signaling information can be a DUT_CALIBRATION_REQUEST message.

Further, the method 290 comprises a step 292 of estimating, in response to the first signaling information, channel transfer function matrices between active antenna ports\RF ports 110\112 of the multi-antenna transceiver of the device under test 100 and antenna ports 134 of the device tester using reference signals wirelessly transmitted from the device tester to the device under test.

In embodiments, the step 292 can comprise activating a group of antenna ports of the beamforming network 104 of the device under test 100 to obtain active antenna ports\RF ports, while deactivating the other antenna ports 110 of the beamforming network 104.

In embodiments, the step 292 can comprise setting specific beamforming network operating parameters to the analog portion of the hybrid beamforming network. The specific beamforming network operating parameters can be, for example, values for the phase shifters and attenuators of the beamforming network.

In embodiments, the step 292 can comprise wirelessly transmitting the estimated channel transfer function matrices or an information derived therefrom form the device under test 100 to the device tester 130. The estimated channel transfer function matrices or the information derived therefrom can be transmitted from the device under test 100 to the device tester 130 using a DUT_CALIBRATION_RESPONSE message.

Further, the method 290 comprises a step 293 of wirelessly transmitting a second signaling information between the device under test and the device tester, the second signaling information indicating a precoded transmission request, wherein the second signaling information is transmitted by the device under test or the device tester.

Further, the method 290 comprises a step 294 of wirelessly transmitting, in response to the second signaling information, reference signals from the device tester to the device under test using precoder matrices selected or determined based on the estimated channel transfer function matrices or the information derived therefrom, to obtain interference free channels between the device tester and the device under test allowing the reference signals to be received independently at each RF port of the multi-antenna receiver of the device under test.

In embodiments, the method can comprise setting the analog portion of the hybrid beamforming network to specific beamforming network operating parameters and maintaining the operating parameters of the analog beamforming network 104 fixed during calibrating/testing of the digital portion of a multi antenna transceiver.

Thereby, the method can comprise wirelessly transmitting a third signaling information from the device under test to the device tester, the third signaling information indicating the specific analog beamforming network operating parameters.

In embodiments, the method can comprise that the DUT freely can change beamforming network operating parameters of the digital portion of the hybrid beamforming network during calibrating/testing of the digital portion of a multiantenna transceiver.

Thereby, the method can comprise wirelessly transmitting a fourth signaling information from the device under test to the device tester, the fourth signaling information indicating the current and/or operational beamforming network operating parameters of the analog portion of the beamforming network 104.

In embodiments, the method can comprise measuring performance metrics specifying the performance of the digital portion of a multi-antenna transceiver or of the RF module. Thereby, the transmit parameters of signals wirelessly transmitted from the device tester to the device under test can be varied, in order to measure the performance metrics specifying the performance of the digital portion of a multiantenna receiver or of the RF module.

Subsequently, the different steps of the DUT BFN test (digital part) in non-anechoic chamber are described in further detail.

In embodiments, e.g., in a first step, the DUT 100/CS 130 sends a receiver testing request (DUT_CALIBRATION_REQUEST message) to the CS 130/DUT 100. The request may also include a predefined setting for the DUT BFN.

In embodiments, e.g., in a second step, the DUT 100 can configure its BFN 104 and select a number of active DUT array ports 110 and sets values for the phase shifters and attenuators of its BFN 104 to a predefined set (which may be signaled from the CS 130).

In embodiments, e.g., in a third step, the DUT 100 can perform measurements on the received reference signals (e.g. CSI_RS or SRS sequences) to estimate the channel matrices D̂(q) between the O CS antenna ports 134/N OTA antennas 132 and the P RF ports 112 of the DUT 100.

In embodiments, e.g., in a fourth step, the DUT 100 can generate a report (DUT_CALIBRATION_RESPONSE message) containing information about the measured MIMO channel matrices in D̂(q), q=1 and sends them via an uplink session or other data exchange interface to the CS 130.

In embodiments, e.g., in a fifth step, the CS 130 can calculate a set of precoder matrices P(q), q=1, Q based on the estimated channel transfer matrices D̂(q), q=1, Q from the DUT 100. The precoder matrices can be applied to the transmitted signals at the CS 130 with the aim to create an equivalent ideally interference-free rank-P downlink\uplink channel allowing the (precoded) transmitted signals from the CS to be received independently at each RF port 112. The CS 130/DUT 100 send/initialize the measurement (DUT_PERFTEST_REQUEST) of certain performance metrics e.g. Throughput. The CS 130 can apply the precoder $P_T(q)=c(q)P(q)H_T(q, t)$, q=1, . . . , Q to the transmitted\received signals, where $H_T$ denotes the time-variant full-polarimetric description of the multipath propagation channel [e.g. any channel model used in 3GPP] including the antenna patterns of O antennas at the CS side as well as the P resulting or predefined antenna/port patterns at the DUT side. In this operation mode, the DUT 100 may send back at time t also the decision on the chosen BFN 104 setting to the CS 130, while keeping actually the analog part of the BFN 104 as in step 2. In this way, the P resulting antenna patterns could be calculated or taken from a database at the CS side to embed them in the propagation channel (matrix $H_T$). In this way $H_T$ can be adaptively changed based on the decision of the DUT 100 w.r.t. the BFN 104. Over the testing time the CS 130 can now vary for example transmit parameters such as power, modulation, channel characteristics and so on. If the settings of the analog BFN of the DUT can not be fixed during the operational mode the feedback analog BFN settings from the DUT 100 may also be applied at the CS 130 to modify P(q).

In other words, the DUT BFN test (digital part) in the non-anechoic chamber allows testing the (entire) receiver in a real environment. The real environment can be generated using a realistic propagation channel (e.g. 3GPP Channel model, etc.). Thereby, the channel can consider the beams formed using the BFN 104. This can be included calculatively using a feedback information from the DUT 100 indicating the settings it would (normally) apply to the BFN 104. However, the DUT 100 may maintain the BFN 104 (analog portion of the hybrid beamforming network) fixed, in order to maintain the wireless cable connection to the P RF ports 112. The digital beamforming actually takes place in the DUT 100 after (downstream) the RF ports 112.

In other words, the DUT BFN test (digital part) in the non-anechoic chamber allows testing the DUT under operational conditions, e.g., w.r.t. throughput in a real channel. For that purpose, the BFN 104 (analog beamforming network) is set to fixed settings even if the DUT 100 (or a software running on the DUT and controlling the DUT) normally would perform changes on the settings of the BFN 104, for example, due to a channel projection onto the P RF Ports. However, these changes\the settings of the analog BFN that would be applied can be feedback to the CS, which may include the resulting beams in the channel.

Although, above the DUT BFN test (digital part) in a non-anechoic chamber\static propagation environment was described for the receive case, the same applies for the transmit case, as will be briefly described in the following.

FIG. 16 shows a flowchart of a method 295 for wirelessly calibrating/testing a digital transmitter module of a multi-antenna transmitter of a device under test. The method 295 comprises a step 296 of wirelessly transmitting a first signaling information between the device under test and a device tester, the first signaling information indicating a calibration request, wherein the first signaling information is transmitted by the device under test or the device tester. The method 295 further comprises a step 297 of estimating, in response to the first signaling information, channel transfer function matrices between active antenna ports or RF ports of the multi-antenna transmitter of the device under test and antenna ports of the device tester using reference signals wirelessly transmitted from the device under test to the device tester. The method 295 further comprises a step 298 of selecting or estimating equalizer matrices using the estimated channel transfer function matrices or the information derived therefrom.

Thereby, an analog beamforming network of the multi-antenna transmitter is set to specific beamforming network parameters and maintained fixed at the set specific beamforming network parameters, during calibrating/testing the digital transmitter module of the multi-antenna receiver, even if the propagation channel between the device under test and the device tester changes to emulate multipath propagation channel. In that case, a third signaling information can be wirelessly transmitting from the device under test to the device tester, the third signaling information indicating specific beamforming network operating parameters the device under test would apply in a normal operation mode to the analog beamforming network responsive to the emulated multipath propagation channel in order to adapt the analog beamforming network in the normal operation mode to the multipath propagation channel.

Further Embodiments

Wireless communication devices equipped with multiple antennas have to be calibrated and tested with respect to overall performance and conformance. These devices are typically highly integrated such that device interfaces are neither available nor accessible. Embodiments described herein provide a non-destructive testing and calibration approach for integrated DUTs equipped with analog, digital and hybrid beamforming networks in arbitrary laboratory environments. Feedback schemes for the new testing and calibration approach are also provided.

Various elements and features of the present invention may be implemented in hardware using analog and/or digital circuits, in software, through the execution of instructions by one or more general purpose or special-purpose processors, or as a combination of hardware and software. For example, embodiments of the present invention may be implemented in the environment of a computer system or another processing system. FIG. 18 illustrates an example of a computer system 400. The units or modules as well as the steps of the methods performed by these units may execute on one or more computer systems 400. The computer system 400 includes one or more processors 402, like a special purpose or a general purpose digital signal processor. The processor 402 is connected to a communication infrastructure 404, like a bus or a network. The computer system 400 includes a main memory 406, e.g., a random access memory (RAM), and a secondary memory 408, e.g., a hard disk drive and/or a removable storage drive. The secondary memory 408 may allow computer programs or other instructions to be loaded into the computer system 400. The computer system 400 may further include a communications interface 410 to allow software and data to be transferred between computer system 400 and external devices. The communication may be in the form electronic, electromagnetic, optical, or other signals capable of being handled by a communications interface. The communication may use a wire or a cable, fiber optics, a phone line, a cellular phone link, an RF link and other communications channels 412.

The terms "computer program medium" and "computer readable medium" are used to generally refer to tangible storage media such as removable storage units or a hard disk installed in a hard disk drive. These computer program products are means for providing software to the computer system 400. The computer programs, also referred to as computer control logic, are stored in main memory 406 and/or secondary memory 408. Computer programs may also be received via the communications interface 410. The computer program, when executed, enable the computer system 400 to implement the present invention. In particular, the computer program, when executed, enable processor 402 to implement the processes of the present invention, such as any of the methods described herein. Accordingly, such a computer program may represent a controller of the computer system 400. Where the disclosure is implemented using software, the software may be stored in a computer program product and loaded into computer system 400 using a removable storage drive, an interface, like communications interface 410.

The implementation in hardware or in software may be performed using a digital storage medium, for example cloud storage, a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention may be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier. In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. A further embodiment of the inventive method is, therefore, a data stream or a sequence of signals representing the computer program for performing one of the methods described herein. The data stream or the sequence of signals may for example be configured to be transferred via a data communication connection, for example via the Internet. A further embodiment comprises a processing means, for example a computer, or a programmable logic device, configured to or adapted to perform one of the methods described herein. A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

LIST OF REFERENCES

[1] Agilent Technologies, "Incorporating self-interference into the two-stage method," in 3*GPP TSG RAN WG*4 *Meeting* #66 *MIMO OTA Ah hoc*, March 2013, available: ftp://ftp.3gpp.org/tsg_ran/WG4_Radio/TSGR4_AHs/TSGR4_66-AH-MIMO-OTA/Docs/R4-66AH-0012.zip.

[2] Agilent Technologies, "Impact of path isolation on radiated second stage," in 3*GPP TSG RAN WG*4 *Meeting*, #69, November 2013, available: http://www.3gpp.org/ftp/tsg_ran/VVG4_Radio/TSGR4_69/docs/R4-136799.zip.

[3] M. Rumney, H. Kong, and Y. Jing, "Practical active antenna evaluation using the two-stage MIMO OTA measurement method," in *Antennas and Propagation (EuCAP)*, 2014 8*th European Conference on*, April 2014, pp. 3500-3503.

[4] M. Rumney, H. Kong, Y. Jing, and X. Zhao, "Advances in antenna pattern-based MIMO OTA test methods," in *Antennas and Propagation (EuCAP)*, 2015 9*th European Conference on*, April 2015.

[5] W. Yu, Y. Qi, "*Method and Device for Testing Performance of Wireless Terinal*", U.S. Pat. No. 9,614,627 B2, General Test Systems Inc., Apr. 4, 2017

[6] European Telecommunications Standards Institute (ETSI), "Universal Mobile Telecommunications System (UMTS); LTE; Universal Terrestrial Radio Access (UTRA) and Evolved Universal Terrestrial radio Access (E-UTRA); Verification of radiated multi-antenna reception performance of User Equipment (UE) (3GPP TR 37.977 version 14.3.0 Release 14)", Technical Report, in 3GPP TR 37.977, v. 14.3.0 Release 14, March, 2003

[7] C. Schirmer, M. Lorenz, W. A. T. Kotterman, R. Perthold, M. H. Landmann and G. Del Galdo, "MIMO over-the-air testing for electrically large objects in non-anechoic environments," 2016 10th European Conference on Antennas and Propagation (EuCAP), Davos, 2016, pp. 1-6. doi: 10.1109/EuCAP.2016.7481106

[8] E. H. Moore, "On the reciprocal of the general algebraic matrix," in Bulletin of the American Mathematical Society 26, 1920, pp. 394-395.

[9] R. Penrose, "A generalized inverse for matrices," in Proceedings of the Cambridge Philosophical Society 51, 1955, pp. 406-413.

[10] P. Kyösti, T. Jämsä, and J.-P. Nuutinen, "Channel modelling for multiprobe Over-the-Air MIMO testing," International Journal of Antennas and Propagation, vol. 2012, 2012.

[11] C. Schirmer, M. Landmann, W. Kotterman, M. Hein, R. Thomä, G.Del Galdo, and A. Heuberger, "3D wave-field synthesis for testing of radio devices," in Antennas and Propagation (EuCAP), 2014 8th European Conference on, April 2014, pp. 3394-3398.

The invention claimed is:

1. A method for wirelessly calibrating/testing a beamforming network of a multi-antenna receiver of a device under test, the method comprising:
   wirelessly transmitting a first signaling information between the device under test and a device tester, the first signaling information indicating a calibration request, wherein the first signaling information is transmitted by the device under test or the device tester;
   estimating, in response to the first signaling information, channel transfer function matrices between active antenna ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester;
   wirelessly transmitting a second signaling information between the device under test and the device tester, the second signaling information indicating a precoded transmission request, wherein the second signaling information is transmitted by the device under test or the device tester; and
   wirelessly transmitting, in response to the second signaling information, precoded reference signals from the device tester to the device under test using precoder matrices selected or determined based on the estimated channel transfer function matrices or the information derived therefrom, to acquire interference free channels between the device tester and the device under test allowing the reference signals to be received independently at each of the active antenna ports of the multi-antenna receiver of the device under test.

2. The method according to claim 1, wherein the multi-antenna receiver of the device under test comprises a beamforming network comprising a plurality of antenna ports and a plurality of RF ports.

3. The method according to claim 2, wherein the method comprises:
   wirelessly transmitting, in response to the first signaling information, a third signaling information, the third signaling information indicating at least one out of active antenna ports, active RF ports and a configuration of the beamforming network.

4. The method according to claim 2, wherein the method comprises:
   determining the frequency response of the beamforming network using the received reference signals and using specific beamforming network operating parameters.

5. The method according to claim 4, wherein the method comprises:
   wirelessly transmitting a fourth signaling information from the device under test to the device tester, the fourth signaling information comprising the determined frequency response of the beamforming network or an information derived therefrom.

6. The method according to claim 2, wherein estimating the channel transfer function matrices comprises connecting each active antenna port to exactly one RF port of the beamforming network of the device under test.

7. The method according to claim 2, wherein the method comprises:
activating a first group of antenna ports of the beamforming network of the device under test to acquire the active antenna ports, while deactivating the other antenna ports of the beamforming network.

8. The method according to claim 7, wherein the method comprises:
activating a second group of antenna ports of the beamforming network of the device under test, while deactivating the other antenna ports of the beamforming network; and
estimating channel transfer function matrices between the second group of antenna ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester.

9. The method according to claim 7, wherein the second signaling information further indicates the active antenna ports of the multi-antenna receiver of the device under test.

10. The method according to claim 9, wherein the method comprises:
activating another group of antenna ports of the beamforming network of the device under test, while deactivating the other antenna ports of the beamforming network; and
wirelessly transmitting precoded reference signals from the device tester to the device under test using precoder matrices selected or determined based on the estimated channel transfer function matrices or the information derived therefrom, to acquire interference free channels between the device tester and the device under test allowing the reference signals to be received independently at each of the antenna ports of the second group of active antenna ports.

11. A method for wirelessly calibrating a receive module of a multi-antenna receiver of a device under test, the method comprising:
wirelessly transmitting a first signaling information between the device under test and a device tester, the first signaling information indicating a calibration request, wherein the first signaling information is transmitted by the device under test or the device tester;
estimating, in response to the first signaling information, channel transfer function matrices between RF ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester;
wirelessly transmitting a second signaling information between the device under test and the device tester, the second signaling information indicating a precoded transmission request, wherein the second signaling information is transmitted by the device under test or the device tester; and
wirelessly transmitting, in response to the second signaling information, reference signals from the device tester to the device under test using precoder matrices selected or determined based on the estimated channel transfer function matrices or the information derived therefrom, to acquire interference free channels between the device tester and the device under test allowing the reference signals to be received independently at each of the RF ports of the multi-antenna receiver of the device under test.

12. The method according to claim 11, wherein the multi-antenna receiver of the device under test comprises a beamforming network comprising a plurality of antenna ports and a plurality of RF ports.

13. The method according to claim 12, wherein the method comprises
activating a group of antenna ports of the beamforming network of the device under test to acquire active antenna ports, while deactivating the other antenna ports of the beamforming network, and connecting the active antenna ports to the RF ports; and/or
setting specific beamforming network operating parameters.

14. The method according to claim 12, wherein the method comprises:
measuring performance metrics specifying the performance of the device under test.

15. A method for wirelessly calibrating antennas of a multi-antenna transceiver of a device under test, the method comprising:
wirelessly transmitting a first signaling information between the device under test and a device tester, the first signaling information indicating a calibration request, wherein the first signaling information is transmitted by the device under test or the device tester;
wirelessly transmitting reference signals between the device under test and the device tester using one active antenna port of the multi-antenna transceiver or using one RF port of the multi-antenna transceiver and a fixed beamforming network, wherein the reference signals are transmitted by the device under test or the device tester;
measuring at least one out of amplitude and phase of an antenna pattern for a first relative orientation between antennas of the device tester and antennas of the device under test,
changing the relative orientation between antennas of the device tester and antennas of the device under test from the first relative orientation to a second relative orientation;
iteratively repeating the steps of wirelessly transmitting reference signals, measuring at least one out of amplitude and phase of the antenna pattern and changing the relative orientation until a predetermined termination criterion is reached.

16. The method according to claim 15, wherein the multi-antenna transceiver of the device under test comprises a beamforming network comprising a plurality of antenna ports and a plurality of RF ports.

17. The method according to claim 15, wherein the method comprises:
wirelessly transmitting a second signaling information from the device under test to the device tester, the second signaling information indicating the antenna ports or RF ports to be measured.

18. The method according to claim 15, the method comprising:
wirelessly transmitting a third signaling information from the device tester to the device under test, the third signaling information indicating a measured antenna pattern.

19. A method for wirelessly calibrating/testing a digital receiver module of a multi-antenna receiver of a device under test, the method comprising:
wirelessly transmitting a first signaling information between the device under test and a device tester, the first signaling information indicating a calibration request, wherein the first signaling information is transmitted by the device under test or the device tester;
estimating, in response to the first signaling information, channel transfer function matrices between active antenna ports or RF ports of the multi-antenna receiver of the device under test and antenna ports of the device tester using reference signals wirelessly transmitted from the device tester to the device under test;
wirelessly transmitting a second signaling information between the device under test and the device tester, the second signaling information indicating a precoded transmission request, wherein the second signaling information is transmitted by the device under test or the device tester; and
wirelessly transmitting, in response to the second signaling information, reference signals from the device tester to the device under test using precoder matrices selected or determined based on the estimated channel transfer function matrices or the information derived therefrom, to acquire interference free channels between the device tester and the device under test allowing the reference signals to be received independently at each active antenna port or RF port of the multi-antenna receiver of the device under test.

20. The method according to claim 19, wherein the multi-antenna receiver comprises an analog beamforming network comprising the plurality of antenna ports and the plurality of RF ports;
wherein the digital receiver module of the multi-antenna receiver is connected to the plurality of RF ports of the analog beamforming network.

21. The method according to claim 20, wherein the method comprises:
setting the analog beamforming network to specific beamforming network operating parameters and maintaining the operating parameters of the analog beamforming network fixed in a calibrating/testing mode used during calibrating/testing the digital receiver module of the multi-antenna receiver.

22. The method according to claim 21, wherein the method comprises:
changing precoder matrices used for transmitting the precoded reference signals from the device tester to the device under test using multipath propagation channel models, to simulate a multipath propagation channel between the device tester and the device under test; and
wirelessly transmitting a third signaling information from the device under test to the device tester, the third signaling information indicating specific beamforming network operating parameters the device under test would apply in a normal operation mode to the analog beamforming network responsive to the simulated multipath propagation channel in order to adapt the analog beamforming network in the normal operation mode to the multipath propagation channel, wherein the device under test maintains the operating parameters of the analog beamforming network fixed in the calibrating/testing mode used during calibrating/testing the digital receiver module of the multi-antenna receiver.

23. The method according to claim 19, wherein the method comprises:
measuring performance metrics specifying the performance of the digital receiver module of the multi-antenna transceiver.

24. The method according to claim 23, wherein the method comprises:
varying transmit parameters of reference signals wirelessly transmitted from the device tester to the device under test, in order to measure the performance metrics specifying the performance of the digital receiver module of the multi-antenna receiver.

25. The method according to claim 20, wherein the method comprises:
activating a group of antenna ports of the analog beamforming network of the device under test to acquire active antenna ports, while deactivating the other antenna ports of the analog beamforming network.

26. A device under test, comprising:
a beamforming network comprising a plurality of antenna ports and a plurality of RF ports;
a plurality of antennas connected to the plurality of antenna ports of the beamforming network;
an RF module connected to the plurality of RF ports of the beamforming network; and
a processor configured to perform the method according to claim 19.

27. The device under test according to claim 26, wherein the device under test is an user equipment or a base station.

28. A device tester, comprising:
a beamforming network comprising a plurality of antenna ports and a plurality of RF ports;
a plurality of antennas connected to the plurality of antenna ports of the beamforming network;
an RF module connected to the plurality of RF ports of the beamforming network; and
a processor configured to perform the method according to claim 19.

29. The device tester according to claim 28, wherein the device tester is an user equipment, a base station or a dedicated device tester.

30. A method for wirelessly calibrating/testing a digital transmitter module of a multi-antenna transmitter of a device under test, wherein the multi-antenna transmitter comprises an analog beamforming network comprising the plurality of antenna ports and the plurality of RF ports, wherein the digital transmitter module of the multi-antenna transmitter is connected to the plurality of RF ports of the analog beamforming network, the method comprising:
wirelessly transmitting a first signaling information between the device under test and a device tester, the first signaling information indicating a calibration request, wherein the first signaling information is transmitted by the device under test or the device tester;
estimating, in response to the first signaling information, channel transfer function matrices between active antenna ports or RF ports of the multi-antenna transmitter of the device under test and antenna ports of the device tester using reference signals wirelessly transmitted from the device under test to the device tester;

selecting or estimating equalizer matrices using the estimated channel transfer function matrices or the information derived therefrom.

31. The method according to claim 30, wherein the method comprises:
setting the analog beamforming network to specific beamforming network parameters and maintaining the parameters of the analog beamforming network fixed in a calibrating/testing mode used during calibrating/testing the digital transmitter module of the multi-antenna receiver.

32. The method according to claim 31, wherein the method comprises:
changing the equalizer matrices used to receive equalized reference signals from the device under test, the reference signals transmitted from the device under test to the device tester using multipath propagation channel models, to emulate a multipath propagation channel between the device under test and the device tester; and
wirelessly transmitting a third signaling information from the device under test to the device tester, the third signaling information indicating specific beamforming network operating parameters the device under test would apply in a normal operation mode to the analog beamforming network responsive to the emulated multipath propagation channel in order to adapt the analog beamforming network in the normal operation mode to the multipath propagation channel, wherein the device under test maintains the operating parameters of the analog beamforming network fixed in the calibrating/testing mode used during calibrating/testing the digital receiver module of the multi-antenna receiver.

33. The method according to claim 30, wherein the method comprises:
measuring performance metrics specifying the performance of the digital transmitter module of the multi-antenna transmitter.

34. The method according to claim 33, wherein the method comprises:
varying transmit parameters of reference signals wirelessly transmitted from the device under test to the device under tester, in order to measure the performance metrics specifying the performance of the digital transmitter module of the multi-antenna transmitter.

35. The method according to claim 30, wherein the method comprises:
activating a group of antenna ports of the analog beamforming network of the device under test to acquire active antenna ports, while deactivating the other antenna ports of the analog beamforming network.

36. A device under test, comprising:
a beamforming network comprising a plurality of antenna ports and a plurality of RF ports;
a plurality of antennas connected to the plurality of antenna ports of the beamforming network;
an RF module connected to the plurality of RF ports of the beamforming network; and
a processor configured to perform the method according to claim 30.

37. A device tester, comprising:
a beamforming network comprising a plurality of antenna ports and a plurality of RF ports;
a plurality of antennas connected to the plurality of antenna ports of the beamforming network;
an RF module connected to the plurality of RF ports of the beamforming network; and
a processor configured to perform the method according to claim 30.

38. A computer program for performing the method for wirelessly calibrating/testing a beamforming network of a multi-antenna receiver of a device under test, the method comprising:
wirelessly transmitting a first signaling information between the device under test and a device tester, the first signaling information indicating a calibration request, wherein the first signaling information is transmitted by the device under test or the device tester;
estimating, in response to the first signaling information, channel transfer function matrices between active antenna ports of the multi-antenna receiver of the device under test and antenna ports of the device tester using reference signals wirelessly transmitted from the device tester to the device under test, and transmitting the estimated channel transfer function matrices or an information derived therefrom from the device under test to the device tester;
wirelessly transmitting a second signaling information between the device under test and the device tester, the second signaling information indicating a precoded transmission request, wherein the second signaling information is transmitted by the device under test or the device tester; and
wirelessly transmitting, in response to the second signaling information, precoded reference signals from the device tester to the device under test using precoder matrices selected or determined based on the estimated channel transfer function matrices or the information derived therefrom, to acquire interference free channels between the device tester and the device under test allowing the reference signals to be received independently at each of the active antenna ports of the multi-antenna receiver of the device under test,
when said computer program is run by a computer.

* * * * *